United States Patent
Kyogoku

(10) Patent No.: US 11,355,592 B2
(45) Date of Patent: Jun. 7, 2022

(54) SEMICONDUCTOR DEVICE, METHOD OF MANUFACTURING SEMICONDUCTOR DEVICE, INVERTER CIRCUIT, DRIVE DEVICE, VEHICLE, AND ELEVATOR

(71) Applicant: KABUSHIKI KAISHA TOSHIBA, Tokyo (JP)

(72) Inventor: Shinya Kyogoku, Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 54 days.

(21) Appl. No.: 17/006,940

(22) Filed: Aug. 31, 2020

(65) Prior Publication Data

US 2021/0296447 A1   Sep. 23, 2021

(30) Foreign Application Priority Data

Mar. 19, 2020 (JP) .............................. JP2020-049315

(51) Int. Cl.
*H01L 29/16* (2006.01)
*H01L 21/02* (2006.01)
(Continued)

(52) U.S. Cl.
CPC .... *H01L 29/1608* (2013.01); *H01L 21/02529* (2013.01); *H01L 21/02532* (2013.01);
(Continued)

(58) Field of Classification Search
CPC ........... H01L 21/1608; H01L 21/02529; H01L 21/02532; H01L 21/526; H01L 29/1095;
(Continued)

(56) References Cited

U.S. PATENT DOCUMENTS

| 5,821,583 A | 10/1998 | Hshieh et al. |
| 9,741,797 B2 | 8/2017 | Kagawa et al. |

(Continued)

FOREIGN PATENT DOCUMENTS

| JP | 4469524 B2 | 5/2010 |
| JP | 2011-216783 A | 10/2011 |

(Continued)

*Primary Examiner* — Igwe U Anya
(74) *Attorney, Agent, or Firm* — Finnegan, Henderson, Farabow, Garrett & Dunner L.L.P.

(57) ABSTRACT

A semiconductor device of an embodiment includes a silicon carbide layer including first and second trenches, a first silicon carbide region of n-type, a second silicon carbide region of p-type disposed between the first trench and the second trench and having a depth deeper than depths of the first and second trenches, and a third silicon carbide region of n-type on the second silicon carbide region, a first gate electrode, a second gate electrode. The second silicon carbide region includes a first region of which a depth becomes deeper toward the second trench, and a second region of which a depth becomes deeper toward the first trench. In the second silicon carbide region, a first concentration distribution of a p-type impurity has a first concentration peak at a first position, and has a second concentration peak at a second position closer to the second trench than the first position.

18 Claims, 22 Drawing Sheets

(51) Int. Cl.
*H01L 29/78* (2006.01)
*H01L 29/10* (2006.01)
*H01L 29/423* (2006.01)
*H01L 29/66* (2006.01)
*H01L 21/265* (2006.01)

(52) U.S. Cl.
CPC ........ *H01L 21/265* (2013.01); *H01L 29/1095* (2013.01); *H01L 29/4236* (2013.01); *H01L 29/66734* (2013.01); *H01L 29/7813* (2013.01)

(58) Field of Classification Search
CPC ........... H01L 29/4236; H01L 29/66734; H01L 29/7813
USPC .......................................................... 257/77
See application file for complete search history.

(56) References Cited

U.S. PATENT DOCUMENTS

| | | | |
|---|---|---|---|
| 2015/0236119 A1* | 8/2015 | Tanaka | H01L 21/26586 257/77 |
| 2016/0149029 A1 | 5/2016 | Takaya et al. | |
| 2017/0047440 A1 | 2/2017 | Ohashi et al. | |
| 2017/0092758 A1 | 3/2017 | Ueno | |
| 2017/0352723 A1* | 12/2017 | Ma | H01L 29/1095 |
| 2018/0122894 A1 | 5/2018 | Kyogoku et al. | |
| 2019/0206987 A1* | 7/2019 | Adachi | H01L 29/1095 |

FOREIGN PATENT DOCUMENTS

| | | |
|---|---|---|
| JP | 2012-4458 A | 1/2012 |
| JP | 2016-100466 A | 5/2016 |
| JP | 6032337 B2 | 11/2016 |
| JP | 2017-38001 A | 2/2017 |
| JP | 2018-74013 A | 5/2018 |
| JP | 2018-182335 A | 11/2018 |

* cited by examiner

SEMICONDUCTOR DEVICE, METHOD OF MANUFACTURING SEMICONDUCTOR DEVICE, INVERTER CIRCUIT, DRIVE DEVICE, VEHICLE, AND ELEVATOR

CROSS-REFERENCE TO RELATED APPLICATION

This application is based upon and claims the benefit of priority from Japanese Patent Application No. 2020-049315, filed on Mar. 19, 2020, the entire contents of which are incorporated herein by reference.

FIELD

Embodiments described herein relate generally to a semiconductor device, a method of a semiconductor device, an inverter circuit, a drive device, a vehicle, and an elevator.

BACKGROUND

Silicon carbide (SiC) is expected as a material for a next-generation semiconductor device. The silicon carbide has excellent physical properties such as a band gap of about 3 times, a breakdown field strength of about 10 times, and a thermal conductivity of about 3 times those of silicon. These physical properties are utilized, and thus, a semiconductor device capable of being operated at a high temperature with low loss can be realized.

In a vertical type metal-oxide-semiconductor field-effect transistor (MOSFET), a trench-gate structure in which a gate electrode is provided in a trench is applied in order to realize low on-resistance. The trench-gate structure is applied, and thus, a channel region per unit area is increased, and the on-resistance is reduced.

Meanwhile, in the trench-gate structure, the electric field strength applied to a gate insulating layer at a bottom of the trench becomes high. Thus, reliability of the gate insulating layer becomes a problem.

In order to relax the electric field strength applied to the gate insulating layer, for example, a deep impurity region adjacent to the trench is formed. In order to form the deep impurity region, an arrangement pitch of trenches is forcibly increased, the channel region per unit area is reduced, and there is a concern that the on-resistance is increased.

DETAILED DESCRIPTION

Figure 1:
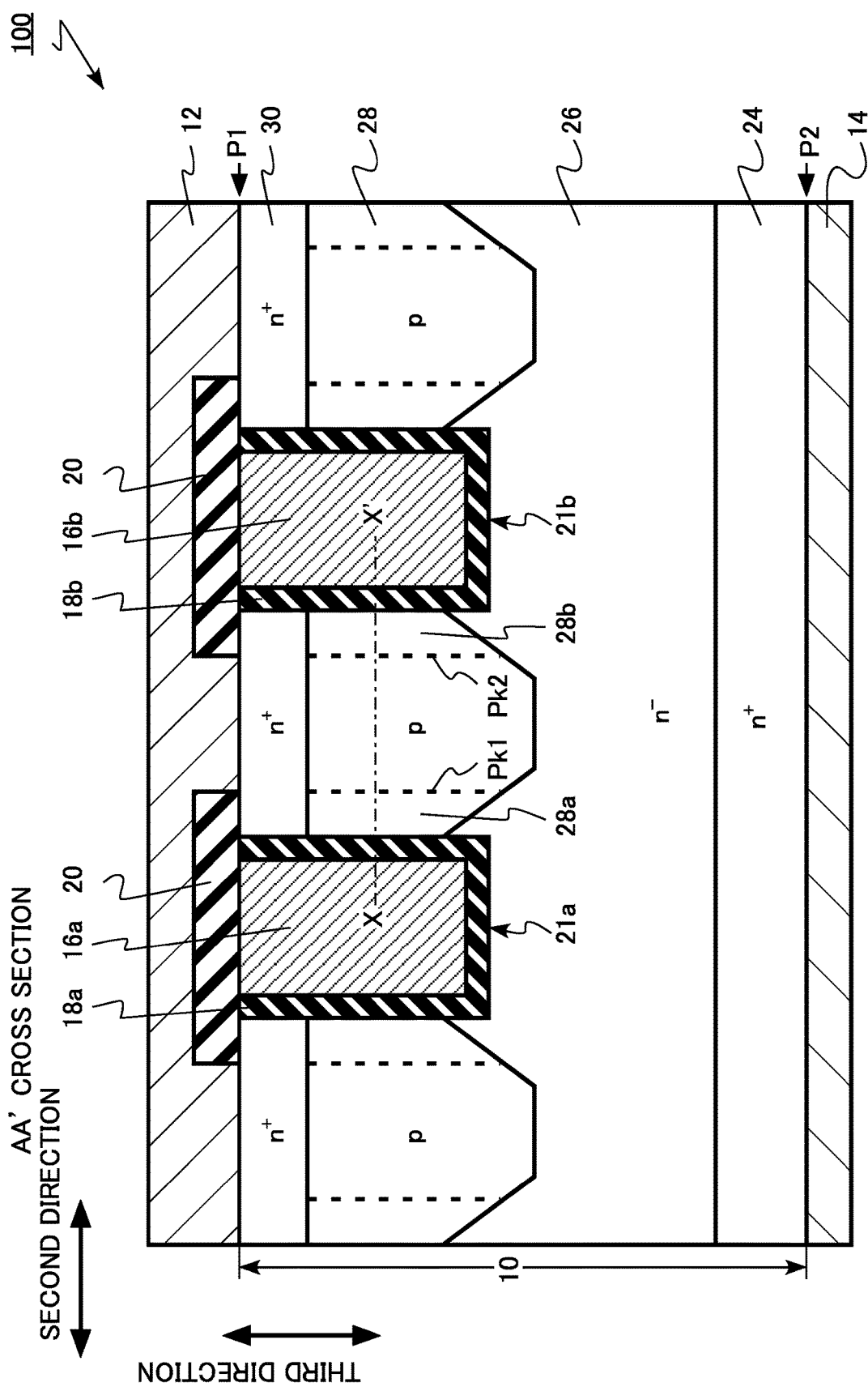
FIG. 1 is a schematic cross-sectional view of a semiconductor device of a first embodiment.

There is provided a semiconductor device of an embodiment including a silicon carbide layer including a first plane parallel to a first direction and a second direction orthogonal to the first direction and a second plane facing the first plane, the silicon carbide layer including a first trench disposed on a side of the first plane and extending in the first direction, a second trench disposed on the side of the first plane and extending in the first direction, a first silicon carbide region of n-type, a second silicon carbide region of p-type disposed between the first silicon carbide region and the first plane, the second silicon carbide region being disposed between the first trench and the second trench, and the second silicon carbide region having a depth deeper than depths of the first trench and the second trench, and a third silicon carbide region of n-type disposed between the second silicon carbide region and the first plane; a first gate electrode disposed in the first trench; a second gate electrode disposed in the second trench; a first gate insulating layer disposed between the first gate electrode and the silicon carbide layer; a second gate insulating layer disposed between the second gate electrode and the silicon carbide layer; a first electrode disposed on the side of the first plane of the silicon carbide layer; and a second electrode disposed on a side of the second plane of the silicon carbide layer, wherein the second silicon carbide region includes a first region and a second region, a depth of the first region becomes deeper in a direction toward the second trench from the first trench, and a depth of the second region becomes deeper in a direction toward the first trench from the second trench, and in the second silicon carbide region, a first concentration distribution of a p-type impurity on a first imaginary line extending in the second direction has a first concentration peak at a first position, and has a second concentration peak at a second position closer to the second trench than the first position.

Hereinafter, embodiments of the present disclosure will be described with reference to the drawings. In the following description, the same or similar members will be denoted by the same reference numerals, and the description of the members once described will be appropriately omitted.

In the following description, when the notations of $n^+$, n, $n^-$, and $p^+$, p, $p^-$ are used, these notations indicate relative levels of impurity concentrations in conductivity types. That is, $n^+$ has an n-type impurity concentration relatively higher than n, and $n^-$ has an n-type impurity concentration relatively lower than n. $p^+$ has a p-type impurity concentration relatively higher than p, and p− has a p-type impurity concentration relatively lower than p. In some cases, $n^+$-type and $n^-$-type are simply referred to as n-type, and $p^+$-type and $p^-$-type are simply referred to as p-type.

The impurity concentration can be measured by, for example, secondary-ion mass spectrometry (SIMS). The relative level of the impurity concentration can be determined from a level of a carrier concentration obtained by, for example, scanning capacitance microscopy (SCM). Distances such as a width and a depth of an impurity region can be obtained by, for example, SIMS. The distance such as width and depth of the impurity region can be obtained from, for example, an SCM image.

A depth of a trench and a thickness of an insulating layer can be measured on, for example, a transmission electron microscope (TEM) image. For example, the depth and thickness can be determined from a SIMS profile.

In the present specification, a "p-type impurity concentration" of a p-type silicon carbide region means a net p-type impurity concentration obtained by subtracting an n-type impurity concentration of this region from a p-type impurity concentration of this region. An "n-type impurity concentration" of an n-type silicon carbide region means a net n-type impurity concentration obtained by subtracting a p-type impurity concentration of this region from an n-type impurity concentration of this region.

First Embodiment

There is provided a semiconductor device of a first embodiment including a silicon carbide layer including a first plane parallel to a first direction and a second direction orthogonal to the first direction and a second plane facing the first plane, the silicon carbide layer including a first trench disposed on a side of the first plane and extending in the first direction, a second trench disposed on the side of the first plane and extending in the first direction, a first silicon carbide region of n-type, a second silicon carbide region of p-type disposed between the first silicon carbide region and the first plane, the second silicon carbide region being disposed between the first trench and the second trench, and the second silicon carbide region having a depth deeper than depths of the first trench and the second trench, and a third silicon carbide region of n-type disposed between the second silicon carbide region and the first plane; a first gate electrode disposed in the first trench; a second gate electrode disposed in the second trench; a first gate insulating layer disposed between the first gate electrode and the silicon carbide layer; a second gate insulating layer disposed between the second gate electrode and the silicon carbide layer; a first electrode disposed on the side of the first plane of the silicon carbide layer; and a second electrode disposed on a side of the second plane of the silicon carbide layer, wherein the second silicon carbide region includes a first region and a second region, a depth of the first region becomes deeper in a direction toward the second trench from the first trench, and a depth of the second region becomes deeper in a direction toward the first trench from the second trench, and in the second silicon carbide region, a first concentration distribution of a p-type impurity on a first imaginary line extending in the second direction has a first concentration peak at a first position, and has a second concentration peak at a second position closer to the second trench than the first position.

A semiconductor device of a first embodiment is a vertical MOSFET 100 using silicon carbide. The MOSFET 100 is a MOSFET having a trench-gate structure in which a gate electrode is provided in a trench. The MOSFET 100 is an re-channel MOSFET using electrons as carriers.

Figure 2:
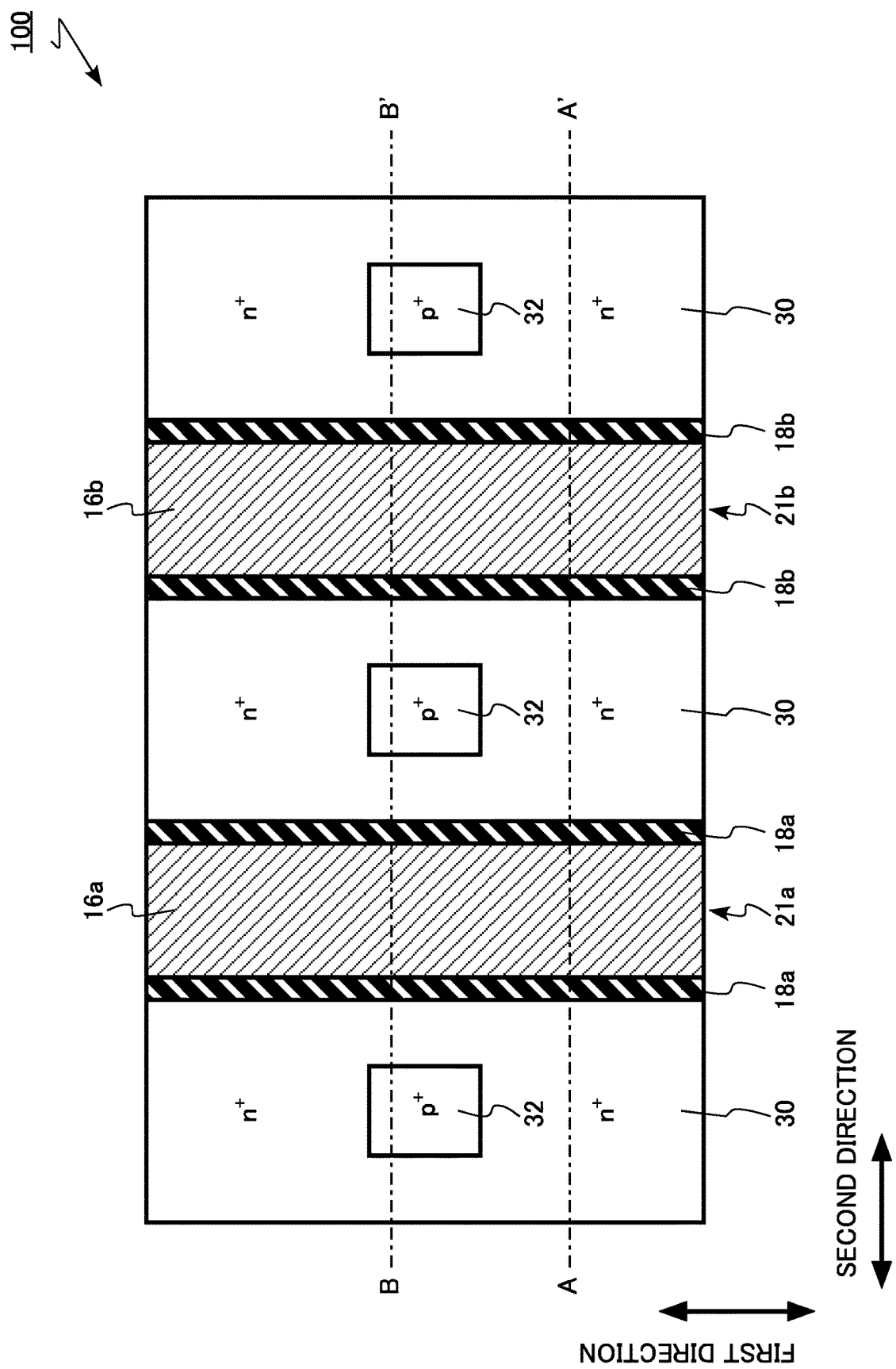
FIG. 2 is a schematic plan view of the semiconductor device of the first embodiment.
Figure 3:
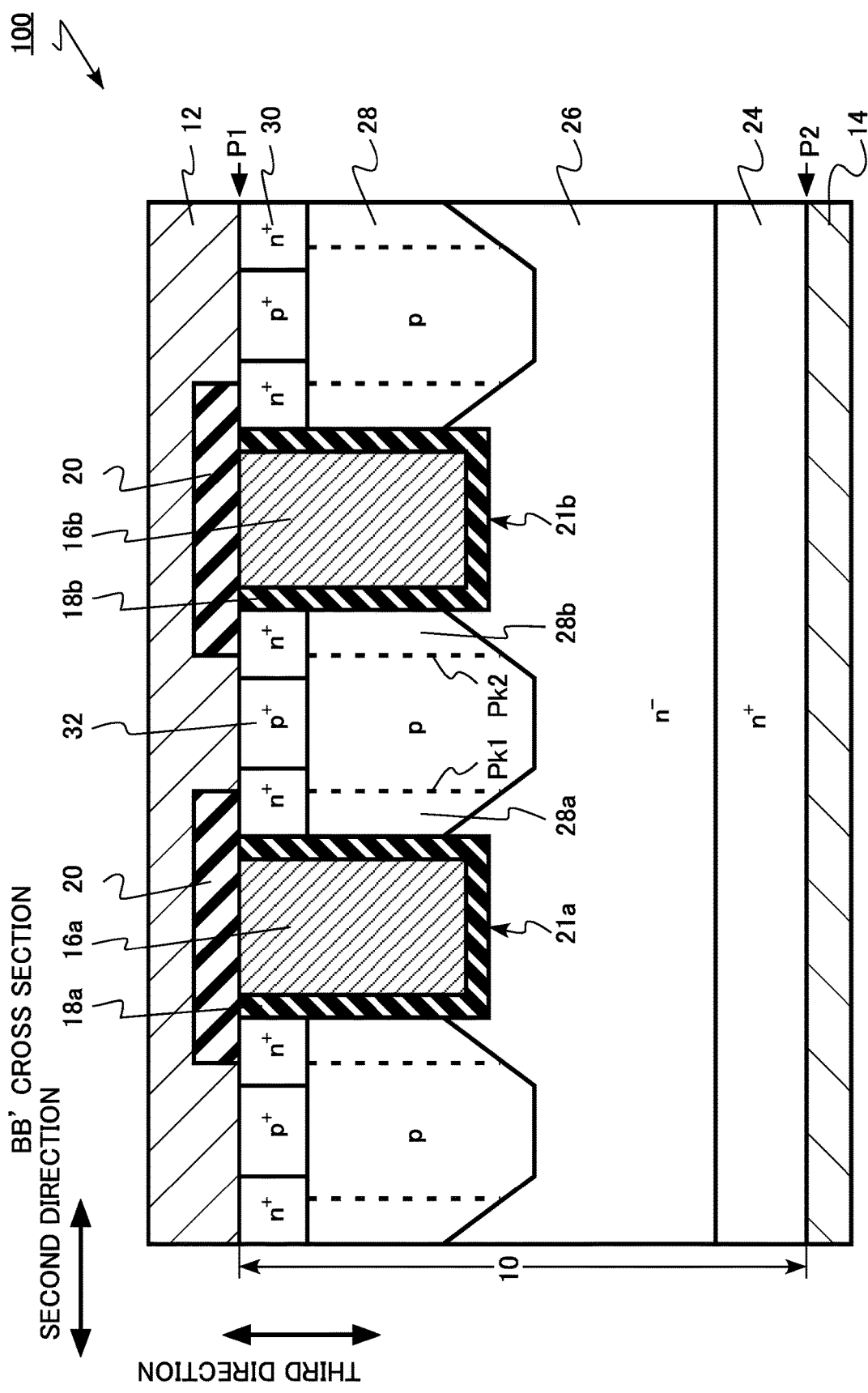
FIG. 3 is a schematic cross-sectional view of the semiconductor device of the first embodiment.

FIG. 1 is a schematic cross-sectional view of the semiconductor device of the first embodiment. FIG. 2 is a schematic plan view of the semiconductor device of the first embodiment. FIG. 3 is a schematic cross-sectional view of the semiconductor device of the first embodiment.

FIG. 1 is a cross-sectional view taken along a line AA' of FIG. 2. FIG. 2 illustrates a pattern on a first plane P1 of FIG. 1. FIG. 3 is a cross-sectional view taken along a line BB' of FIG. 2.

The MOSFET 100 includes a silicon carbide layer 10, a source electrode 12 (first electrode), a drain electrode (second electrode), a first gate electrode 16a, a second gate electrode 16b, a first gate insulating layer 18a, a second gate insulating layer 18b, and interlayer insulating layers 20.

The silicon carbide layer 10 includes a first trench 21a, a second trench 21b, an $n^+$-type drain region 24, an $n^-$-type drift region 26 (first silicon carbide region), and a p-type body region 28 (second silicon carbide region), an $n^+$-type source region 30 (third silicon carbide region), and $p^+$-type contact regions 32 (fourth silicon carbide region).

The body region 28 includes a first region 28a and a second region 28b. The first region 28a has a first concentration peak Pk1. The second region 28b has a second concentration peak Pk2.

The silicon carbide layer 10 is disposed between the source electrode 12 and the drain electrode 14. The silicon carbide layer 10 includes a first plane ("P1" in FIG. 1) and a second plane ("P2" in FIG. 1). Hereinafter, the first plane P1 is also referred to as a front face, and the second plane P2 is also referred to as a rear face. The second plane P2 faces the first plane P1.

A first direction and a second direction are directions parallel to the first plane P1. The first plane P1 is a plane parallel to the first direction and the second direction. The second direction is a direction orthogonal to the first direction. A third direction is a direction perpendicular to the first plane. The third direction is a direction perpendicular to the first direction and the second direction.

Hereinafter, the "depth" means a depth using the first plane P1 as a reference.

The silicon carbide layer 10 is a single crystal SiC. The silicon carbide layer 10 is, for example, 4H—SiC. For example, a thickness of the silicon carbide layer 10 is equal to or more than 5 μm and is equal to or less than 500 μm.

The first plane P1 is, for example, a plane inclined with respect to a (0001) plane by an angle that is equal to or more than 0 degrees and is equal to or less than 8 degrees. That is, the first plane is a plane of which a normal line is inclined with respect to a c-axis in a [0001] direction by an angle that is equal to or more than 0 degrees and is equal to or less than 8 degrees. In other words, an off angle with respect to the (0001) plane is equal to or more than 0 degrees and is equal to or less than 8 degrees. The second plane P2 is, for example, a plane inclined with respect to a (000-1) plane by an angle that is equal to or more than 0 degrees and is equal to or less than 8 degrees.

The (0001) plane is called a silicon face. The (000-1) plane is called a carbon face. An inclined direction of the first plane P1 and the second plane P2 is, for example, a [11-20] direction. The [11-20] direction is an a-axis direction. In FIGS. 1, 2, and 3, for example, the first direction or the second direction illustrated in the drawings is the a-axis direction.

The first trench 21a is present in the silicon carbide layer 10. The first trench 21a is disposed on a side of the first plane P1 of the silicon carbide layer 10. The first trench 21a is a groove formed in the silicon carbide layer 10.

The first trench 21a extends in the first direction, as illustrated in FIG. 2. The first trench 21a has a stripe shape as illustrated in FIG. 2.

The first trench 21a penetrates the source region 30 and the body region 28.

For example, a depth of the first trench 21a is equal to or more than 1 µm and is equal to or less than 2 µm. For example, a width of the first trench 21a in the second direction is equal to or more than 0.5 µm and is equal to or less than 1 µm.

The second trench 21b is present in the silicon carbide layer 10. The second trench 21b is disposed on a side of the first plane P1 of the silicon carbide layer 10. The second trench 21b is a groove formed in the silicon carbide layer 10.

The second trench 21b extends in the first direction as illustrated in FIG. 2. The second trench 21b has a stripe shape as illustrated in FIG. 2.

The second trench 21b penetrates the source region 30 and the body region 28.

For example, a depth of the second trench 21b is equal to or more than 1 µm and is equal to or less than 2 µm. For example, a width of the second trench 21b in the second direction is equal to or more than 0.5 µm and is equal to or less than 1 µm.

The first trench 21a and the second trench 21b are adjacent to each other in the second direction as illustrated in FIGS. 1, 2, and 3. The first trenches 21a and the second trench 21b are repeatedly arranged in the second direction.

The first gate electrode 16a is disposed in the first trench 21a. The first gate electrode 16a is provided between the source electrode 12 and the drain electrode 14. The first gate electrode 16a extends in the first direction.

The first gate electrode 16a is a conductive layer. The first gate electrode 16a is, for example, polycrystalline silicon containing a p-type impurity or an n-type impurity.

The second gate electrode 16b is disposed in the second trench 21b. The second gate electrode 16b is provided between the source electrode 12 and the drain electrode 14. The second gate electrode 16b extends in the first direction.

The second gate electrode 16b is a conductive layer. The second gate electrode 16b is, for example, polycrystalline silicon containing a p-type impurity or an n-type impurity.

The first gate insulating layer 18a is disposed between the first gate electrode 16a and the silicon carbide layer 10. The first gate insulating layer 18a is provided between the source region 30, the body region 28, the drift region 26, and the first gate electrode 16a.

The first gate insulating layer 18a is, for example, a silicon oxide film. For example, an insulating film having a high dielectric constant can be applied to the first gate insulating layer 18a. For example, a stacked film of a silicon oxide film and an insulating film having a high dielectric constant can be applied to the first gate insulating layer 18a.

The second gate insulating layer 18b is disposed between the second gate electrode 16b and the silicon carbide layer 10. The second gate insulating layer 18b is provided between the source region 30, the body region 28, the drift region 26, and the second gate electrode 16b.

The second gate insulating layer 18b is, for example, a silicon oxide film. For example, an insulating film having a high dielectric constant can be applied to the second gate insulating layer 18b. For example, a stacked film of a silicon oxide film and an insulating film having a high dielectric constant can be applied to the second gate insulating layer 18b.

The interlayer insulating layer 20 is provided on the first gate electrode 16a and the second gate electrode 16b. The interlayer insulating layer 20 is provided between the first gate electrode 16a and the source electrode 12. The interlayer insulating layer 20 is provided between the second gate electrode 16b and the source electrode 12.

For example, a thickness of the interlayer insulating layer 20 is deeper than a thickness of the first gate insulating layer 18a and the second gate insulating layer 18b. The interlayer insulating layer 20 is, for example, a silicon oxide film. The interlayer insulating layer 20 electrically isolates the first gate electrode 16a and the second gate electrode 16b from the source electrode 12.

The source electrode 12 is disposed on a side of the first plane P1 of the silicon carbide layer 10. The source electrode 12 is provided on the first plane P1 of the silicon carbide layer 10. The source electrode 12 is in contact with the source region 30 and the contact region 32. The source electrode 12 is in contact with the source region 30 and the contact region 32 on the first plane P1 of the silicon carbide layer 10.

The source electrode 12 contains metal. The metal for forming the source electrode 12 has, for example, a stacked structure of titanium (Ti) and aluminum (Al). The source electrode 12 may contain, for example, metal silicide or metal carbide in contact with the silicon carbide layer 10.

The drain electrode 14 is disposed on a side of the second plane P2 of the silicon carbide layer 10. The drain electrode 14 is provided on the second plane P2 of the silicon carbide layer 10. The drain electrode 14 is in contact with the drain region 24.

The drain electrode 14 is, for example, metal or a metal semiconductor compound. The drain electrode 14 contains, for example, a material selected from the group consisting of nickel silicide (NiSi), titanium (Ti), nickel (Ni), silver (Ag), and gold (Au).

The $n^+$-type drain region 24 is provided on a side of the second plane P2 of the silicon carbide layer 10. The drain region 24 contains, for example, nitrogen (N) as n-type impurities. For example, the n-type impurity concentration of the drain region 24 is equal to or more than $1\times10^{18}$ cm$^{-3}$ and is equal to or less than $1\times10^{21}$ cm$^{-3}$.

The $n^-$-type drift region 26 is provided on the drain region 24. The drift region 26 is disposed between the first plane P1 and the drain region 24.

The drift region 26 contains, for example, nitrogen (N) as n-type impurities. The n-type impurity concentration of the drift region 26 is lower than the n-type impurity concentration of the drain region 24. For example, the n-type impurity concentration of the drift region 26 is equal to or more than $4\times10^{14}$ cm$^{-3}$ and is equal to or less than $1\times10^{18}$ cm$^{-3}$.

The p-type body region 28 is disposed between the drift region 26 and the first plane P1. The body region 28 is disposed between the first trench 21a and the second trench 21b.

The body region 28 functions as a channel formation region of the MOSFET 100. For example, when the MOSFET 100 is turned on, channels through which electrons flow are formed in a region of the body region 28 in contact with the first gate insulating layer 18a and a region of the body region 28 in contact with the second gate insulating layer 18b. The region of the body region 28 in contact with the first gate insulating layer 18a and the region of the body region 28 in contact with the second gate insulating layer 18b are channel formation regions.

The body region 28 has a function of relaxing an electric field applied to the first gate insulating layer 18a at a bottom of the first trench 21a when the MOSFET 100 is turned off. The body region 28 has a function of relaxing an electric field applied to the second gate insulating layer 18b at a bottom of the second trench 21b when the MOSFET 100 is turned off. The body region 28 is fixed at the same electric potential as the source electrode 12.

The body region 28 includes the first region 28a and the second region 28b. The first region 28a is disposed between the first trench 21a and the second region 28b.

A depth of the first region 28a becomes deeper in a direction away from the first trench 21a. The depth of the first region 28a becomes deeper in a direction away from the first gate insulating layer 18a. The depth of the first region 28a becomes deeper in a direction toward the second trench 21b from the first trench 21a.

A depth of the second region 28b becomes deeper in a direction away from the second trench 21b. The depth of the second region 28b becomes deeper in a direction away from the second gate insulating layer 18b. The depth of the second region 28b becomes deeper in a direction toward the first trench 21a from the second trench 21b.

The first region 28a has the first concentration peak Pk1 of the p-type impurity (dotted line in FIGS. 1 and 3) at a first position distant from a side face of the first trench 21a by a predetermined distance. The first concentration peak Pk1 is continuous along the side face of the first trench 21a.

The second region 28b has the second concentration peak Pk2 of the p-type impurity at a second position distant from a side face of the second trench 21b by a predetermined distance. The second concentration peak Pk2 is continuous along the side face of the second trench 21b.

The body region 28 contains, for example, aluminum (Al) as a p-type impurity. For example, the p-type impurity concentration of the body region 28 is equal to or more than $5\times10^{16}$ cm$^{-3}$ and is equal to or less than $1\times10^{19}$ cm$^{-3}$.

A depth of the body region 28 is deeper than the depth of the first trench 21a. A maximum depth of the body region 28 is deeper than the depth of the first trench 21a. The depth of the body region 28 is deeper than the depth of the second trench 21b. The maximum depth of the body region 28 is deeper than the depth of the second trench 21b. For example, the depth of the body region 28 is equal to or more than 1.5 μm and is equal to or less than 3.0 μm.

Figure 4:
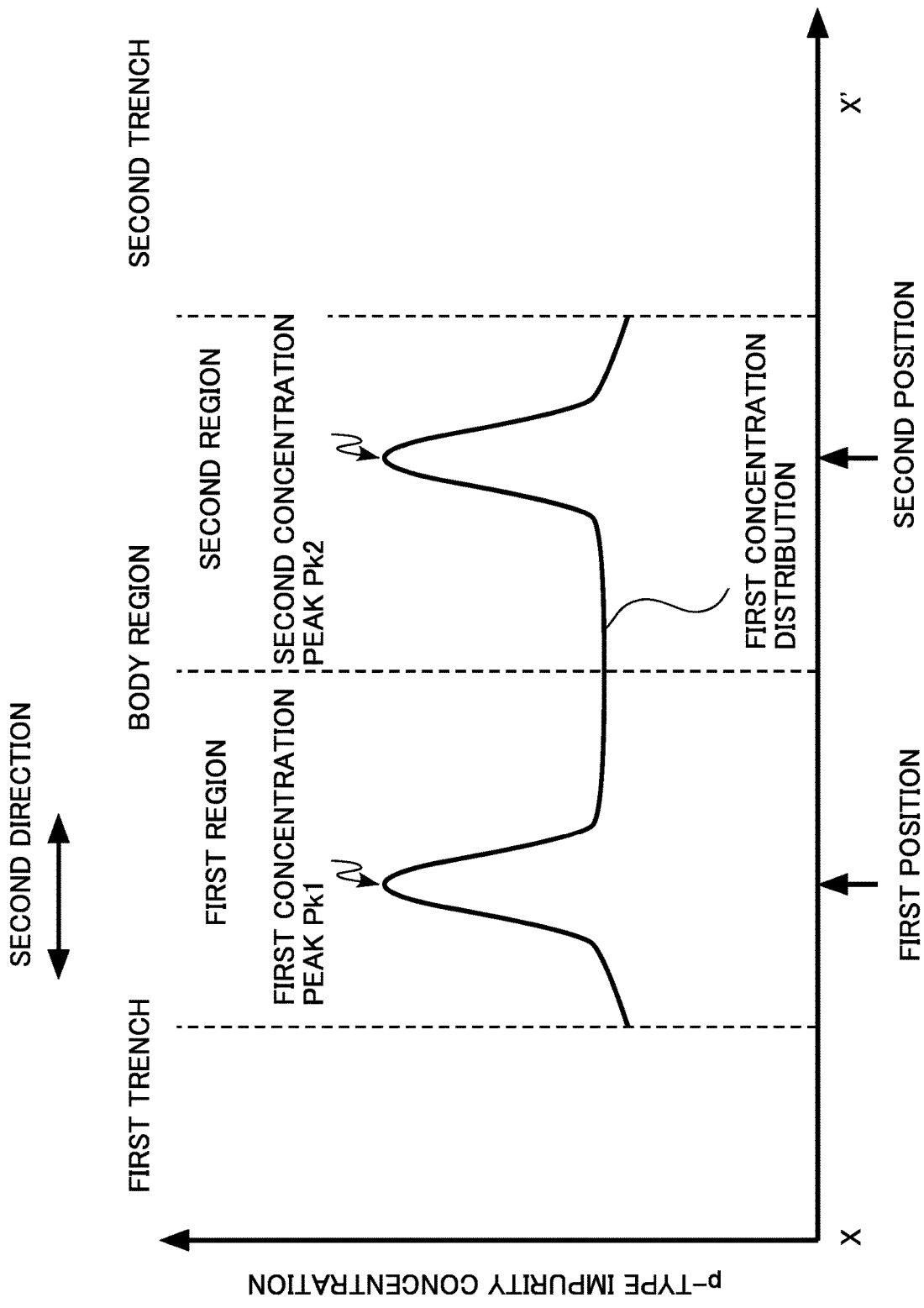
FIG. 4 is a diagram illustrating an impurity concentration distribution of the semiconductor device of the first embodiment.

FIG. 4 is a diagram illustrating an impurity concentration distribution of the semiconductor device of the first embodiment. FIG. 4 illustrates a concentration distribution of the p-type impurity of the body region 28 in the second direction.

In the body region 28, a first concentration distribution of the p-type impurity on a first imaginary line (X-X' in FIG. 1) extending in the second direction has the first concentration peak Pk1 at the first position. The first concentration distribution has the second concentration peak Pk2 at the second position closer to the second trench than the first position. A distance from the first trench 21a to the first position and a distance from the second trench 21b to the second position are substantially the same.

For example, the p-type impurity concentrations at the first position and the second position are equal to or more than $1\times10^{18}$ cm$^{-3}$ and are equal to or less than $1\times10^{19}$ cm$^{-3}$. For example, the p-type impurity concentrations of a portion between the first position and the first trench 21a and the p-type impurity concentration of a portion between the second position and the second trench 21b are equal to or more than $1\times10^{17}$ cm$^{-3}$ and are equal to or less than $5\times10^{17}$ cm$^{-3}$.

The n$^+$-type source region 30 is disposed between the body region 28 and the first plane P1. The source region 30 is disposed between the first trench 21a and the second trench 21b.

The source region 30 is in contact with the source electrode 12. The source region 30 is in contact with the first gate insulating layer 18a and the second gate insulating layer 18b.

The source region 30 contains, for example, phosphorus (P) as n-type impurities. The n-type impurity concentration of the source region 30 is higher than the n-type impurity concentration of the drift region 26. For example, the n-type impurity concentration of the source region 30 is equal to or more than $1\times10^{19}$ cm$^{-3}$ and is equal to or less than $1\times10^{21}$ cm$^{-3}$.

A depth of the source region 30 is less than the depth of the body region 28. For example, the depth of the source region 30 is equal to or more than 0.1 μm and is equal to or less than 0.4 μm.

The p$^+$-type contact region 32 is disposed between the body region 28 and the first plane P1. The contact region 32 is in contact with the body region 28. The contact region 32 is adjacent to the source region 30. The contact region 32 is in contact with the source region 30. The contact region 32 is in contact with the source electrode 12.

The contact region 32 contains, for example, aluminum (Al) as a p-type impurity. The p-type impurity concentration of the contact region 32 is higher than the p-type impurity concentration of the body region 28. For example, the p-type impurity concentration of the contact region 32 is equal to or more than 10 times the p-type impurity concentration of the body region 28. For example, the p-type impurity concentration of the contact region 32 is equal to or more than $5\times10^{17}$ cm$^{-3}$ and is equal to or less than $5\times10^{20}$ cm$^{-3}$.

Next, an example of a method of manufacturing the semiconductor device of the first embodiment will be described.

There is provided a method of manufacturing a semiconductor device of the first embodiment. The method includes forming a mask material on a side of a first plane of a silicon carbide layer having the first plane parallel to a first direction and a second direction orthogonal to the first direction and a second plane facing the first plane and including a first silicon carbide region of n-type disposed between the second plane and the first plane; forming openings extending in the first direction in the mask material; forming trenches by etching the silicon carbide layer using the mask material as a mask; forming a first region of a second silicon carbide region of p-type by performing a first ion implantation for ion implanting a p-type impurity into the silicon carbide layer in a direction inclined with respect to a normal line of the first plane at a first angle in the second direction, the ion implanting the p-type impurity being performed by using the mask material as a mask; forming a second region of the second silicon carbide region in contact with the first region by performing a second ion implantation for ion implanting a p-type impurity into the silicon carbide layer in a direction inclined with the normal line of the first plane at a second angle, the second angle is in a direction opposite to the first angle in the second direction, the ion implanting the p-type impurity being performed by using the mask material as the mask; forming a third silicon carbide region of n-type between the second silicon carbide region and the first plane; forming a gate insulating layer in the trench; forming a gate electrode on the gate insulating layer in the trench; forming a first electrode on a side of the first plane of the silicon carbide layer; and forming a second electrode on a side of the second plane of the silicon carbide layer.

FIGS. 5, 6, 7, 8, 9, 10, 11, and 12 are schematic cross-sectional views illustrating an example of the method of manufacturing the semiconductor device of the first embodiment. FIGS. 5, 6, 7, 8, 9, 10, 11, and 12 illustrate cross sections corresponding to FIG. 1.

First, the silicon carbide layer 10 including the $n^+$-type drain region 24 and the $n^-$-type drift region 26 formed on the drain region 24 by epitaxial growth is prepared. The drift region 26 is formed on the drain region 24 by, for example, an epitaxial growth method.

The silicon carbide layer 10 includes the first plane P1 and the second plane P2. The second plane P2 faces the first plane P1. The first plane P1 is the plane parallel to the first direction and the second direction.

The second direction is the direction orthogonal to the first direction. The third direction is the direction perpendicular to the first plane. The third direction is the direction perpendicular to the first direction and the second direction.

Figure 5:
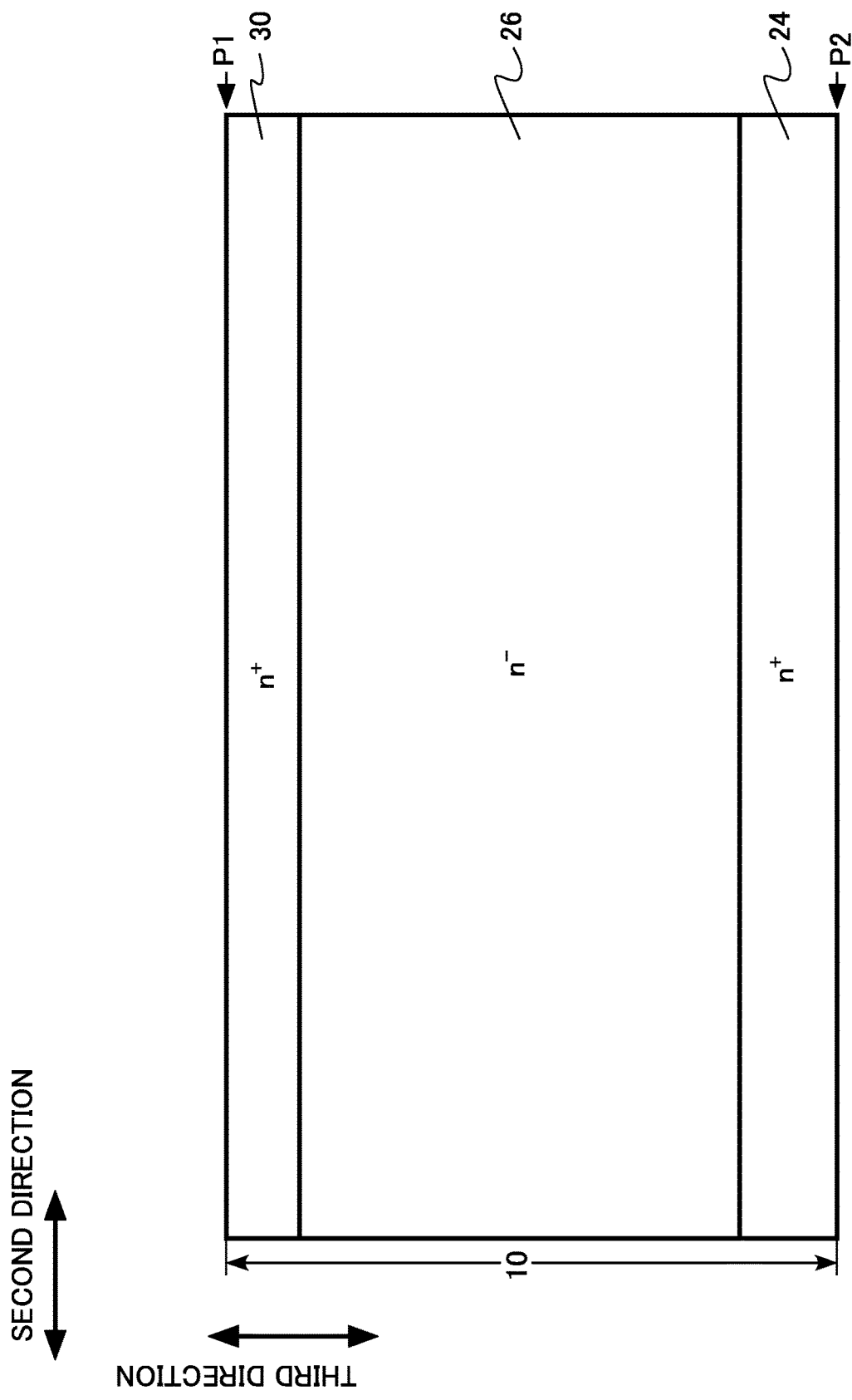
FIG. 5 is a schematic cross-sectional view illustrating an example of a method of manufacturing the semiconductor device of the first embodiment.

Subsequently, the $n^+$-type source region 30 is formed in the drift region 26 by an ion implantation method (FIG. 5). The source region 30 is formed between the drift region 26 and the first plane P1.

Subsequently, the $p^+$-type contact region 32 (not illustrated) is formed in the drift region 26 by the ion implantation method.

Subsequently, a mask material 50 is formed on the front face of the silicon carbide layer 10. The mask material 50 is formed by, for example, a chemical vapor deposition method (CVD method). The mask material 50 is, for example, a silicon oxide film.

Figure 6:
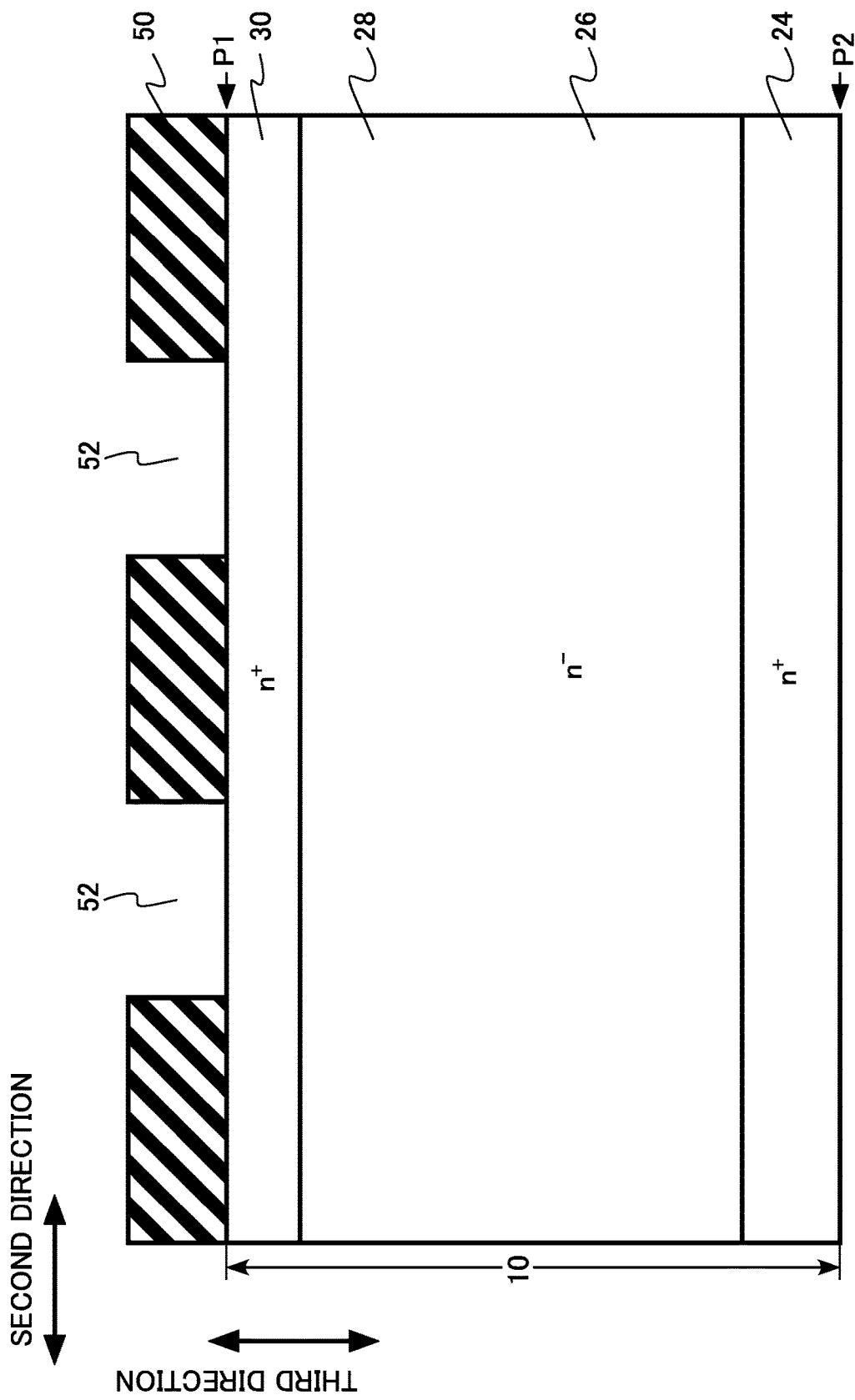
FIG. 6 is a schematic cross-sectional view illustrating an example of the method of manufacturing the semiconductor device of the first embodiment.

Subsequently, openings 52 extending in the first direction are formed in the mask material 50 (FIG. 6). The openings 52 are formed by patterning the mask material 50 using a lithography method and a reactive ion etching method (RIE method).

Figure 7:
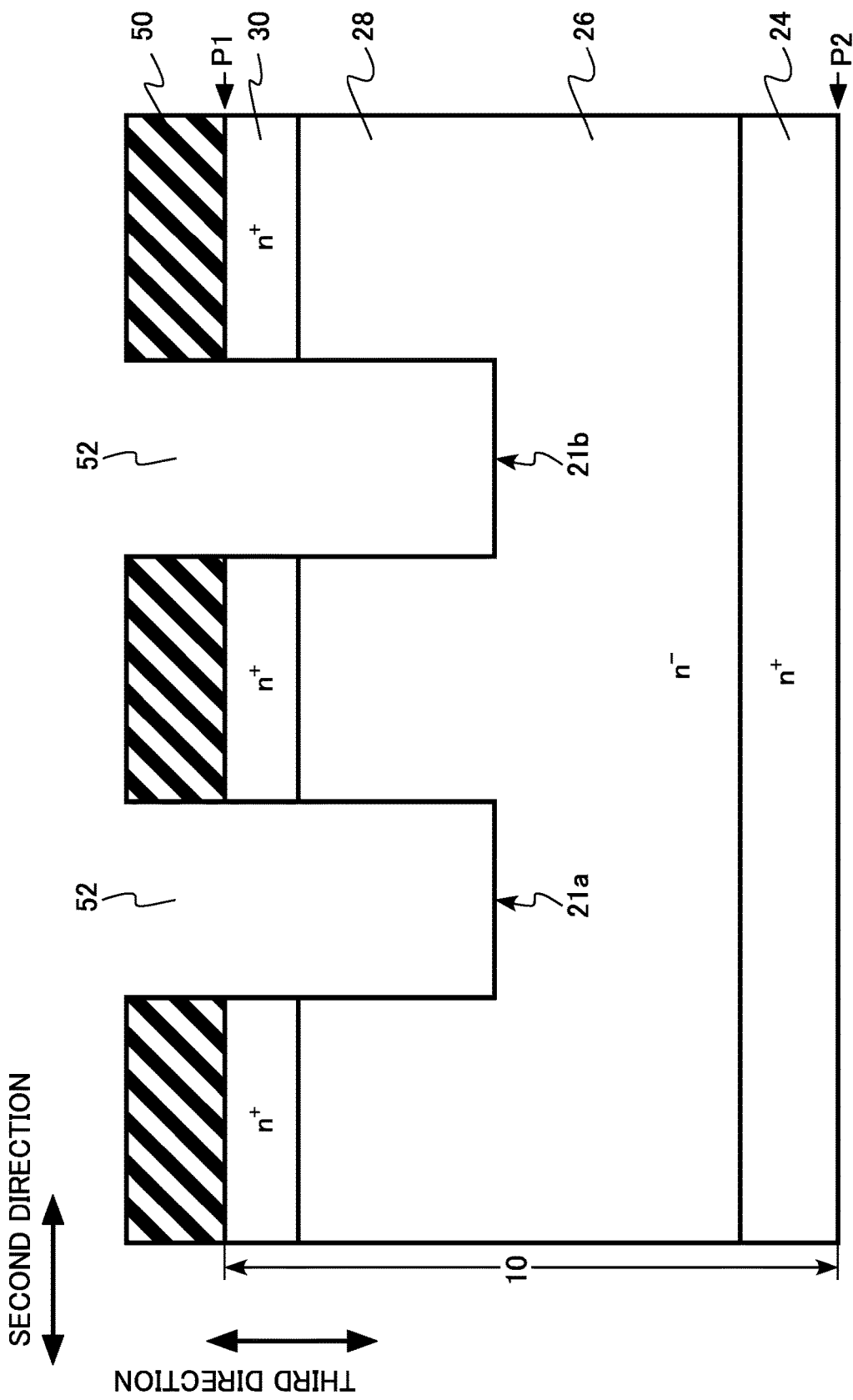
FIG. 7 is a schematic cross-sectional view illustrating an example of the method of manufacturing the semiconductor device of the first embodiment.

Subsequently, the first trench 21a and the second trench 21b are formed by etching the silicon carbide layer 10 using the mask material 50 as a mask (FIG. 7). The first trench 21a and the second trench 21b are formed by using the RIE method. The first trench 21a and the second trench 21b are formed so as to penetrate the source region 30. The first trench 21a and second trench 21b are formed in the silicon carbide layer 10 below the openings 52 of the mask material 50.

Figure 8:
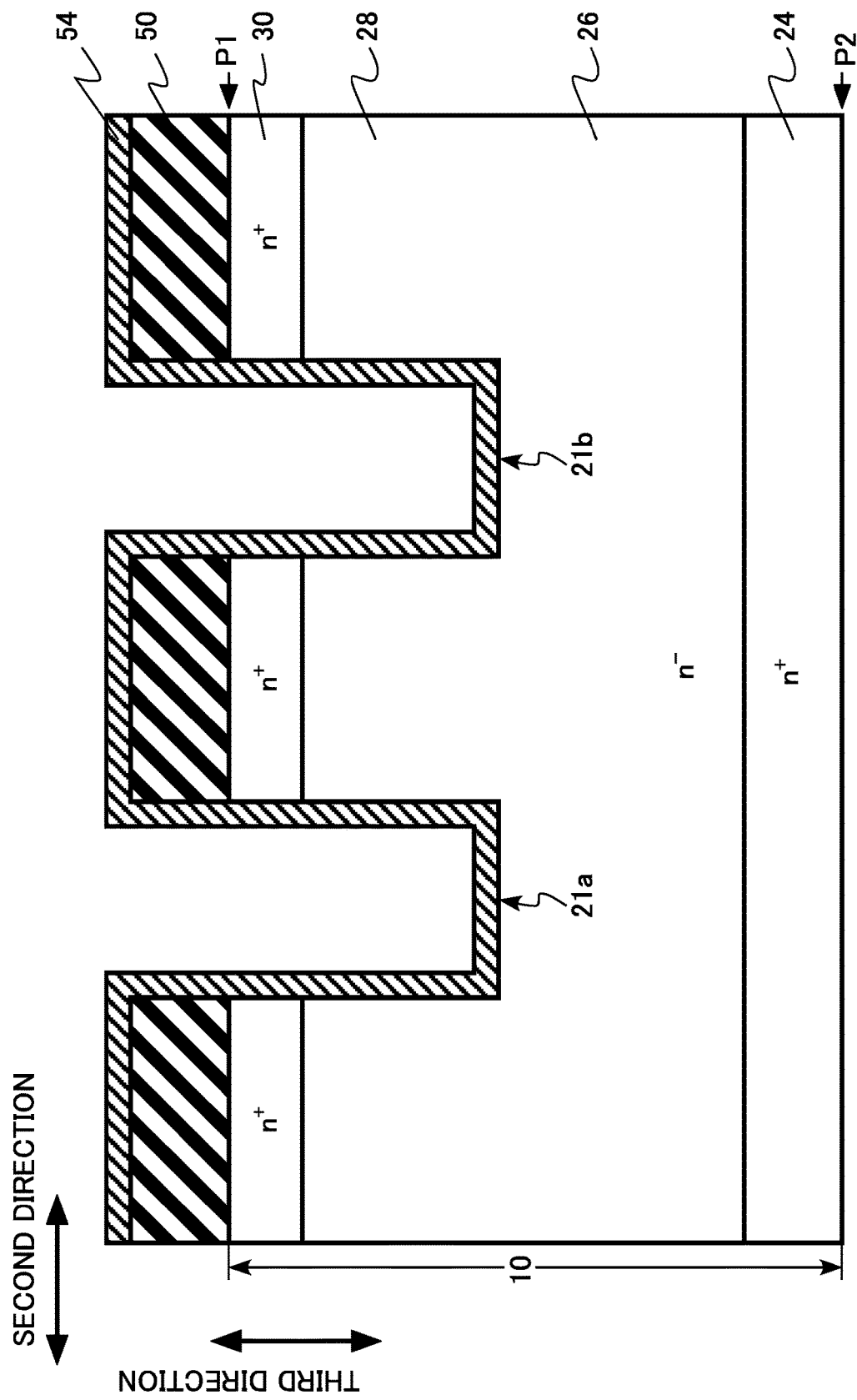
FIG. 8 is a schematic cross-sectional view illustrating an example of the method of manufacturing the semiconductor device of the first embodiment.

Subsequently, an insulating film 54 is formed in the first trench 21a and the second trench 21b (FIG. 8). The insulating film 54 is formed by, for example, the CVD method. The insulating film 54 is, for example, a silicon oxide film.

Figure 9:
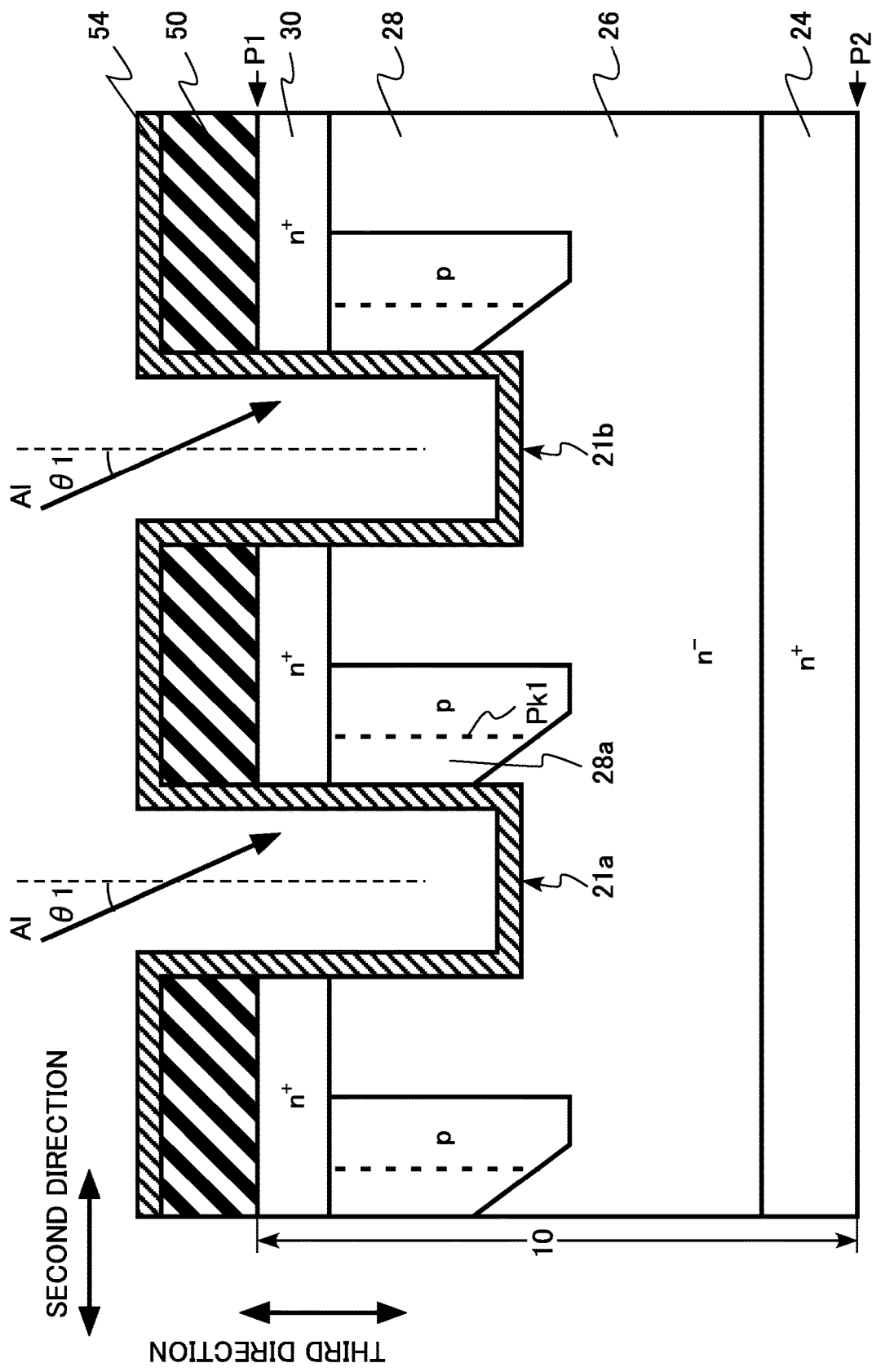
FIG. 9 is a schematic cross-sectional view illustrating an example of the method of manufacturing the semiconductor device of the first embodiment.

Subsequently, the first region 28a of the p-type body region 28 is formed (FIG. 9). The first region 28a is formed by a first ion implantation for ion implanting aluminum ions by using the mask material 50 as the mask. The aluminum ions are an example of the p-type impurity.

In the first ion implantation, the aluminum ions are injected into the silicon carbide layer 10 in a direction inclined with respect to a normal line of the first plane P1 at a first angle (θ1 in FIG. 9) in the second direction. The aluminum ions are injected into the silicon carbide layer 10 from the side face of one of the first trench 21a and the second trench 21b. For example, the first angle θ1 is equal to or more than 20 degrees and is equal to or less than 60 degrees.

In the first region 28a, the first concentration peaks Pk1 of the p-type impurity are formed at positions distant from the side faces of the first trench 21a and the second trench 21b by a predetermined distance. The first concentration peak Pk1 corresponds to a projected range of the first ion implantation.

The first ion implantation may be performed by multiple times. When the first ion implantation is performed by multiple times, a plurality of concentration peaks of the p-type impurity may be formed in the first region 28a.

Figure 10:
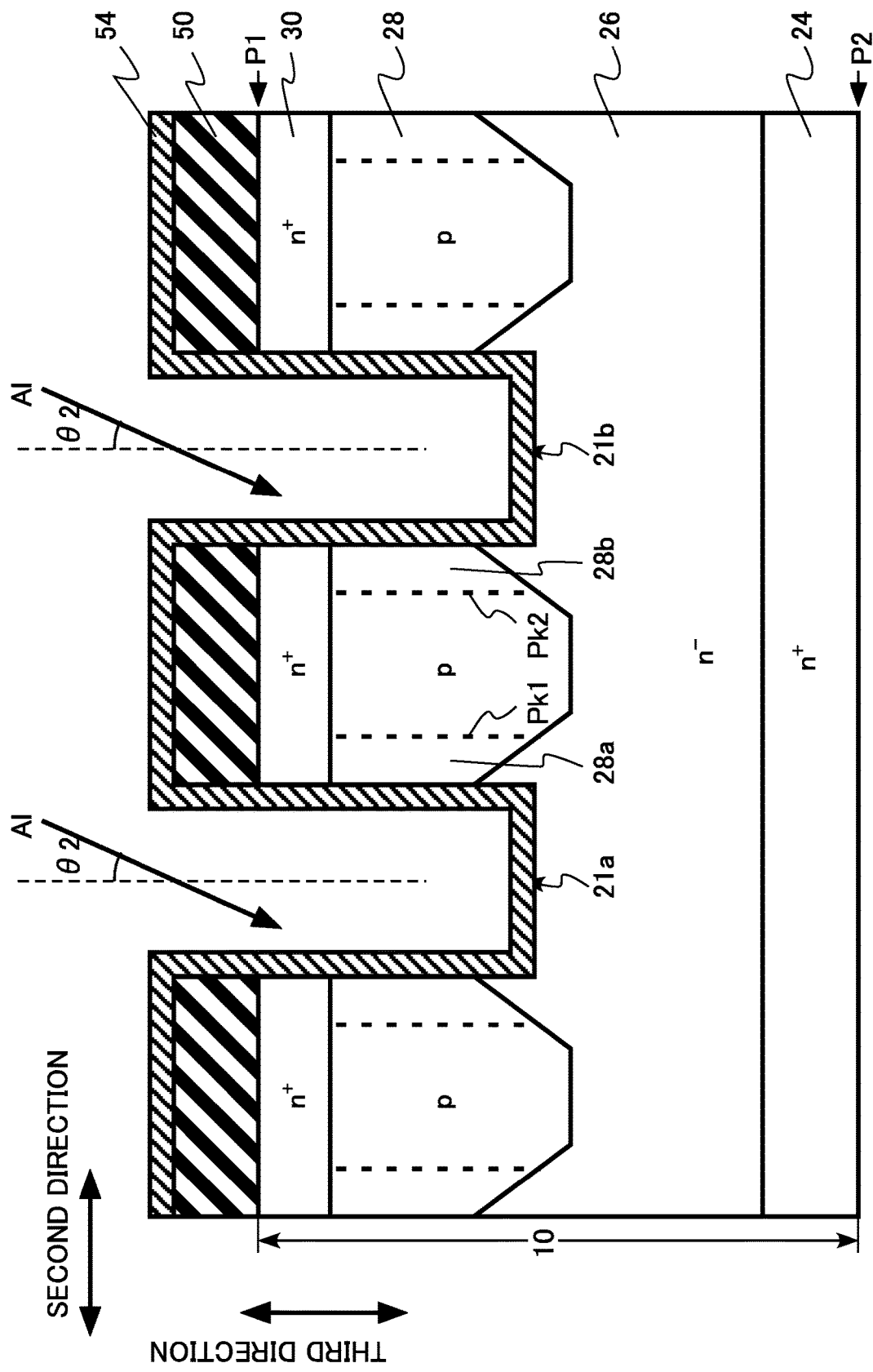
FIG. 10 is a schematic cross-sectional view illustrating an example of the method of manufacturing the semiconductor device of the first embodiment.

Subsequently, the second region 28b of the p-type body region 28 is formed (FIG. 10). The second region 28b is formed by a second ion implantation for ion implanting the aluminum ions by using the mask material 50 as the mask. The aluminum ions are an example of the p-type impurity.

In the second ion implantation, the aluminum ions are ion implanted into the silicon carbide layer 10 in a direction inclined with respect to the normal to the first plane P1 at a second angle (θ2 in FIG. 10) in the second direction. The second angle is inclined in a direction opposite to the direction of the first angle in the second direction. The aluminum ions are injected into the silicon carbide layer 10 from side faces of the first trench 21a and the second trench 21b opposite to the side faces in the first ion implantation. For example, the second angle θ2 is equal to or more than 20 degrees and is equal to or less than 60 degrees.

The second region 28b is formed so as to be in contact with the first region 28a.

In the second region 28b, the second concentration peaks Pk2 of the p-type impurity are formed at a position distant from the side faces of the first trench 21a and the second trench 21b by a predetermined distance. The second concentration peak Pk2 corresponds to a projected range of the second ion implantation.

The second ion implantation may be performed by multiple times. When the second ion implantation is performed by multiple times, a plurality of concentration peaks of the p-type impurity may be formed in the second region 28b.

Figure 11:
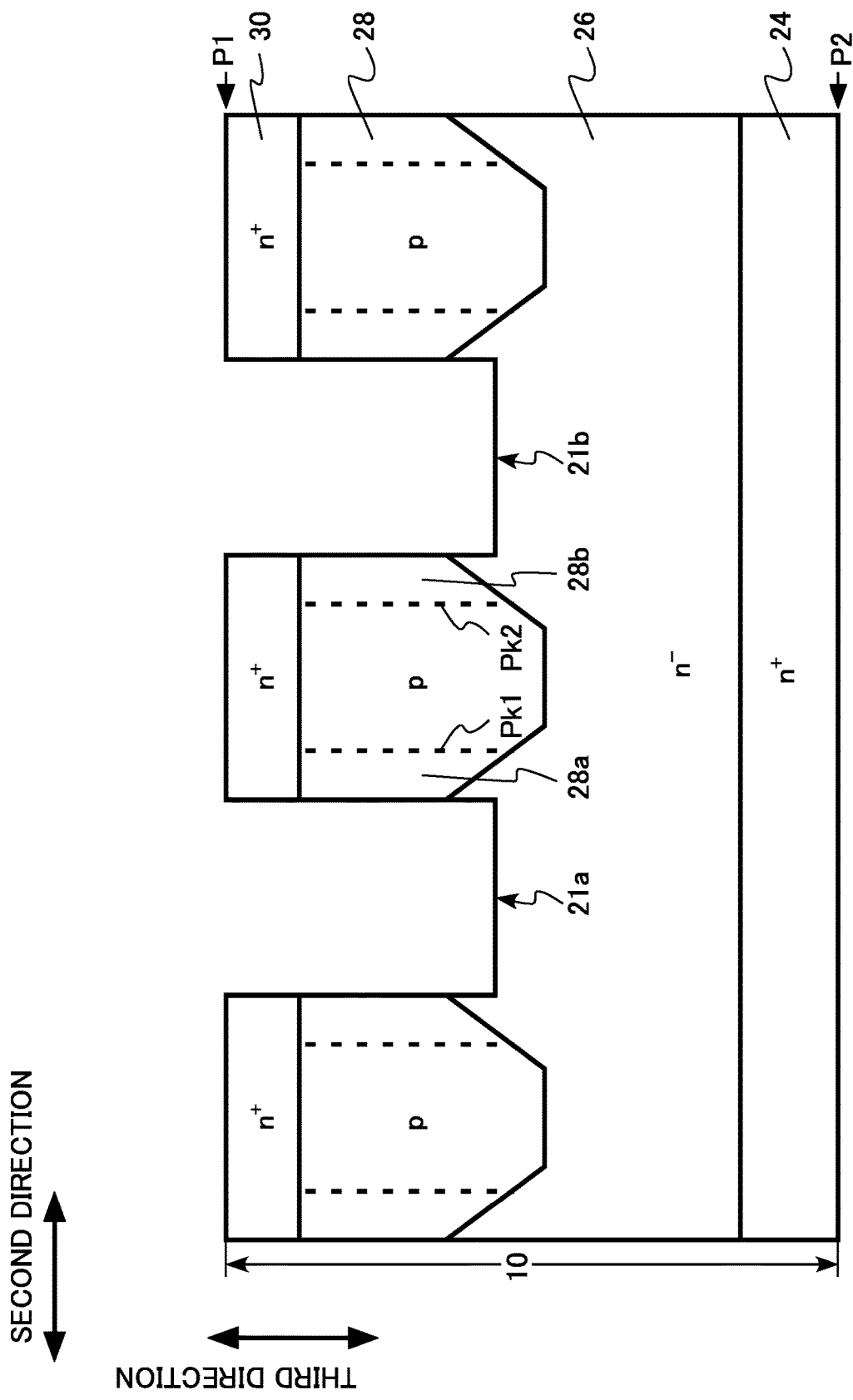
FIG. 11 is a schematic cross-sectional view illustrating an example of the method of manufacturing the semiconductor device of the first embodiment.

Subsequently, the mask material 50 and the insulating film 54 are removed (FIG. 11). Subsequently, activation annealing of the n-type impurity and the p-type impurity is performed.

Subsequently, the first gate insulating layer 18a is formed in the first trench 21a, and the second gate insulating layer 18b is formed in the second trench 21b. The first gate insulating layer 18a and the second gate insulating layer 18b are, for example, silicon oxide formed by the CVD method.

Subsequently, the first gate electrode 16a is formed on the first gate insulating layer 18a in the first trench 21a, and the second gate electrode 16b is formed on the second gate insulating layer 18b in the second trench 21b. The first gate electrode 16a and the second gate electrode 16b are, for example, polycrystalline silicon formed by the CVD method.

Figure 12:
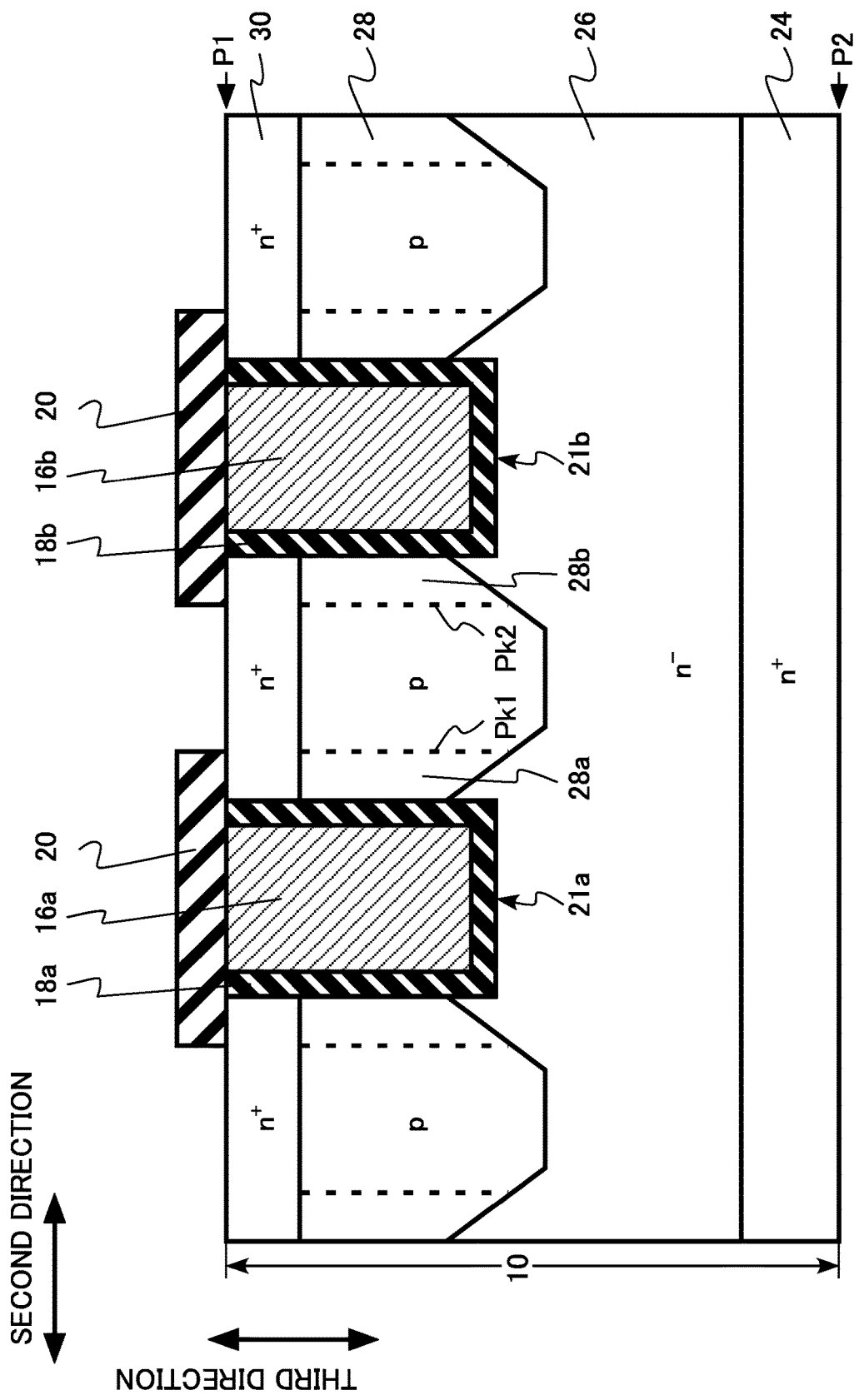
FIG. 12 is a schematic cross-sectional view illustrating an example of the method of manufacturing the semiconductor device of the first embodiment.

Subsequently, the interlayer insulating layer 20 is formed on the first gate electrode 16a and the second gate electrode 16b (FIG. 12). The interlayer insulating layer 20 is, for example, silicon oxide formed by the CVD method.

Thereafter, the source electrode 12 is formed on a side of the first plane of the silicon carbide layer 10, and the drain electrode 14 is formed on a side of the second plane of the silicon carbide layer 10 by using a known process technique.

The MOSFET 100 illustrated in FIGS. 1 to 3 is manufactured by the above manufacturing method.

Next, functions and effects of the semiconductor device and the method of manufacturing the semiconductor device according to the first embodiment will be described.

The trench-gate structure in which the gate electrode is provided in the trench is applied to the MOSFET 100. Due to the application of the trench-gate structure, a channel region per unit area is increased, and thus, an on-resistance of the MOSFET 100 is reduced.

In the trench-gate structure, electric field strength applied to the gate insulating layer at the bottom of the trench becomes high. Thus, reliability of the gate insulating layer becomes a problem.

In order to relax the electric field strength applied to the gate insulating layer, for example, a deep p-type impurity region adjacent to the trench is formed. In order to form the deep p-type impurity region, another trench is formed between, for example, the trench and the trench. In such a case, it is unavoidable to widen an arrangement pitch of the trenches by forming a new trench. The channel region per unit area is reduced, and thus, there is a concern that the on-resistance is increased.

The MOSFET 100 includes the p-type body region 28 deeper than the first trench 21a and the second trench 21b. The deep p-type body region 28 functions as an electric field relaxation region for reducing the electric field strength applied to the first gate insulating layer 18a and the second gate insulating layer 18b. Thus, the reliability of the MOSFET 100 is improved.

The deep p-type body region 28 is formed by ion implanting the p-type impurity from the side face of the first trench 21a and the second trench 21b. Thus, it is not necessary to provide an additional trench in order to form the deep p-type impurity region. Accordingly, the arrangement pitch of the trenches can be reduced, and the on-resistance of the MOSFET 100 can be reduced.

The depth of the first region 28a of the body region 28 becomes deeper in the direction away from the first trench 21a. The depth of the second region 28b of the body region 28 becomes deeper in the direction away from the second trench 21b. In other words, a width of the drift region 26 sandwiched between two body regions 28 is widened toward the drain region 24. Thus, when the MOSFET 100 is turned on, electrons exiting the channel formed in the body region 28 are likely to be diffused laterally. Accordingly, the on-resistance of the MOSFET 100 can be reduced.

The first region 28a has the first concentration peak Pk1 (dotted line in FIGS. 1 and 3) of the p-type impurity at the first position distant from the side face of the first trench 21a by a predetermined distance. The portion at which the p-type impurity concentration is low between the first position and the first trench 21a is the channel formation region of the MOSFET 100. A channel is formed in the channel formation region when the MOSFET 100 is turned on.

The first concentration peak Pk1 having a high p-type impurity concentration is formed at the first position of the channel formation region opposite to the first trench 21a, and thus, the electric field extending from a side of the drift region 26 to the body region 28 is restrained from extending. Thus, a short channel effect of the MOSFET 100 can be reduced. Accordingly, a channel length of the MOSFET 100 can become short, and the depth of the first trench 21a can become shallow.

Similarly, the second concentration peak Pk2 having a high p-type impurity concentration is formed at the second position of the channel formation region opposite to the second trench 21b, and thus, the electric field extending from the side of the drift region 26 to the body region 28 is restrained from extending. Thus, the short channel effect of the MOSFET 100 can be reduced. Accordingly, the channel length of the MOSFET 100 can become short, and the depth of the second trench 21b can become shallow.

A portion between the first position and the second position is relatively far from the first trench 21a and the second trench 21b. Thus, the contribution of the portion between the first position and the second position to the reduction of the electric field strength for the first gate insulating layer 18a and the second gate insulating layer 18b is low. Accordingly, the p-type impurity concentration can be reduced as compared with the first position and the second position. The p-type impurity concentration of the portion between the first position and the second position can be reduced, and thus, the amount of crystal defects in the body region 28 can be reduced. Accordingly, a junction leak current when the MOSFET 100 is turned off can be reduced.

In the method of manufacturing the MOSFET 100 of the first embodiment, the deep p-type body region 28 is formed by ion implanting the p-type impurity from the side face of the first trench 21a and the side face of the second trench 21b. Thus, it is not necessary to manufacture the deep p-type impurity region in a different process from the body region 28. Accordingly, the MOSFET 100 can be easily formed.

It is preferable that the insulating film 54 is formed in the first trench 21a and the second trench 21b before the first ion implantation and the second ion implantation. The insulating film 54 is provided, and thus, the ions reflected within the trenches remain in the insulating film 54 when the first ion implantation and the second ion implantation are performed. Thus, for example, the ions are restrained from being injected into an unplanned region such as the bottom of the trench.

As described above, according to the first embodiment, the MOSFET capable of reducing the on-resistance can be realized. The MOSFET capable of restraining the short channel effect can be realized. The MOSFET capable of reducing the junction leak current can be realized.

Second Embodiment

A semiconductor device according to a second embodiment is different from the semiconductor device of the first embodiment in that a first trench has a first side face and a first bottom face, a second silicon carbide region is in contact with the first side face and the first bottom face, a second trench has a second side face and a second bottom face, and a second silicon carbide region is in contact with the second side face and the second bottom face. Hereinafter, a part of contents overlapping with the contents of the first embodiment will not be described.

The semiconductor device of the second embodiment is a vertical MOSFET 200 using silicon carbide. The MOSFET 200 is a MOSFET having a trench-gate structure in which a gate electrode is provided in a trench. The MOSFET 200 is an n-channel MOSFET using electrons as carriers.

Figure 13:
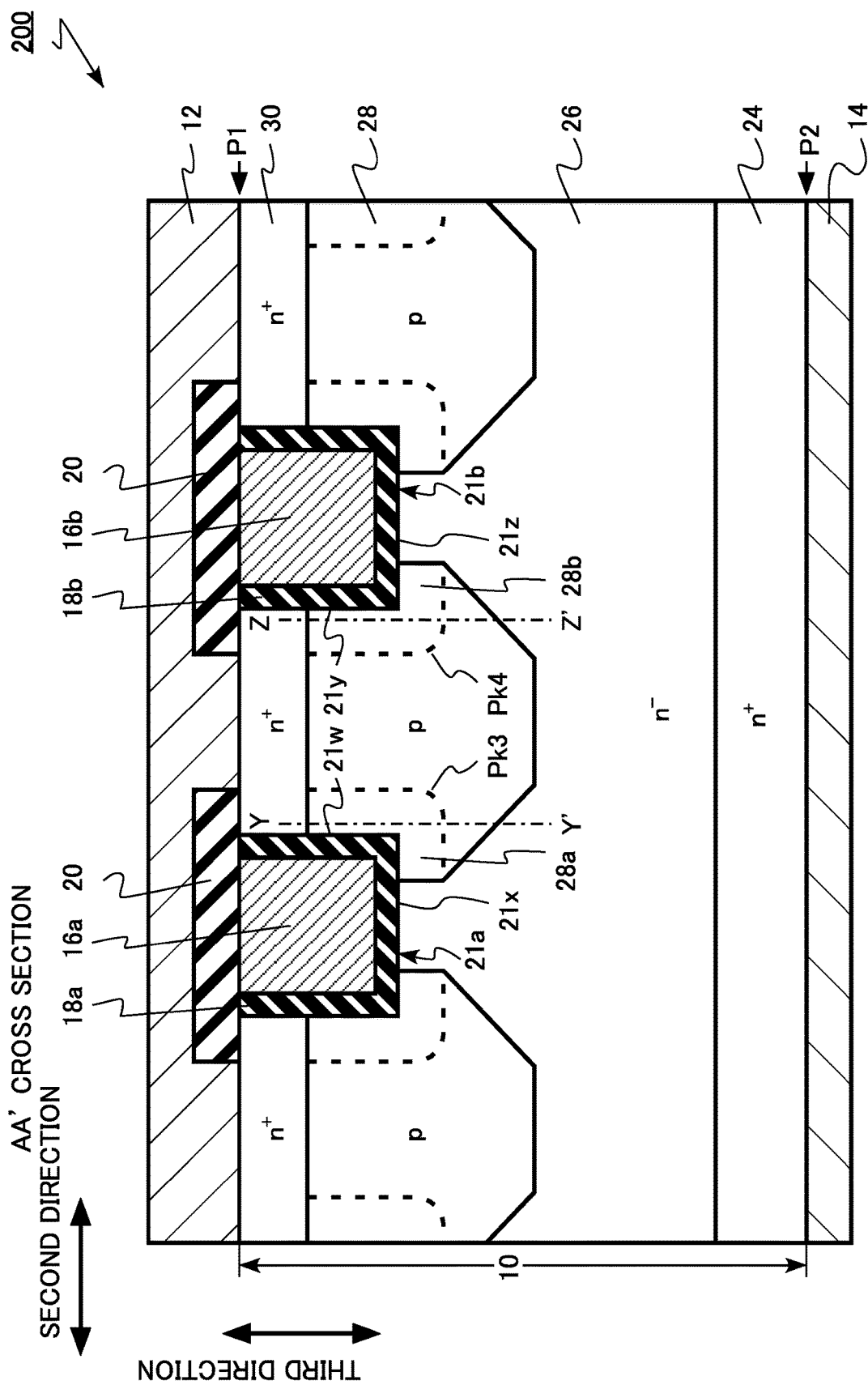
FIG. 13 is a schematic cross-sectional view of a semiconductor device of a second embodiment.

FIG. 13 is a schematic cross-sectional view of the semiconductor device of the second embodiment. FIG. 13 is a cross section corresponding to FIG. 1 of the first embodiment.

The MOSFET 200 includes a silicon carbide layer 10, a source electrode 12 (first electrode), a drain electrode 14 (second electrode), a first gate electrode 16a, a second gate electrode 16b, a first gate insulating layer 18a, a second gate insulating layer 18b, and interlayer insulating layers 20.

The silicon carbide layer 10 includes a first trench 21a, a second trench 21b, an n$^+$-type drain region 24, an n$^-$-type drift region 26 (first silicon carbide region), and a p-type body region 28 (second silicon carbide region), an n$^+$-type source region 30 (third silicon carbide region), and p$^+$-type contact regions 32 (fourth silicon carbide region).

The body region 28 includes a first region 28a and a second region 28b. The first region 28a has a third concentration peak Pk3. The second region 28b has a fourth concentration peak Pk4.

The silicon carbide layer 10 is disposed between the source electrode 12 and the drain electrode 14. The silicon carbide layer 10 includes a first plane ("P1" in FIG. 13) and a second plane ("P2" in FIG. 13). Hereinafter, the first plane P1 is also referred to as a front face, and the second plane P2 is also referred to as a rear face. The second plane P2 faces the first plane P1.

The first trench 21a includes a first side face 21w and a first bottom face 21x. The second trench 21b includes a second side face 21y and a second bottom face 21z.

For example, depths of the first trench 21a and the second trench 21b are equal to or more than 0.5 μm and are equal to or less than 1.5 μm.

The body region 28 is in contact with the first side face 21w and the first bottom face 21x. The body region 28 is in contact with the second side face 21y and the second bottom face 21z.

The body region 28 includes the first region 28a and the second region 28b. The first region 28a is disposed between the first trench 21a and the second trench 21b.

The first region 28a has the third concentration peak Pk3 of the p-type impurity (dotted lines in FIG. 13) at a position distant from the first side face 21w and the first bottom face 21x of the first trench 21a by a predetermined distance. The third concentration peak Pk3 is continuous along the first side face 21w and the first bottom face 21x.

The second region 28b has the fourth concentration peak Pk4 of the p-type impurity at a position distant from the second side face 21y and the second bottom face 21z of the second trench 21b by a predetermined distance. The fourth concentration peak Pk4 is continuous along the second side face 21y and the second bottom face 21z of the second trench 21b.

Figure 14:
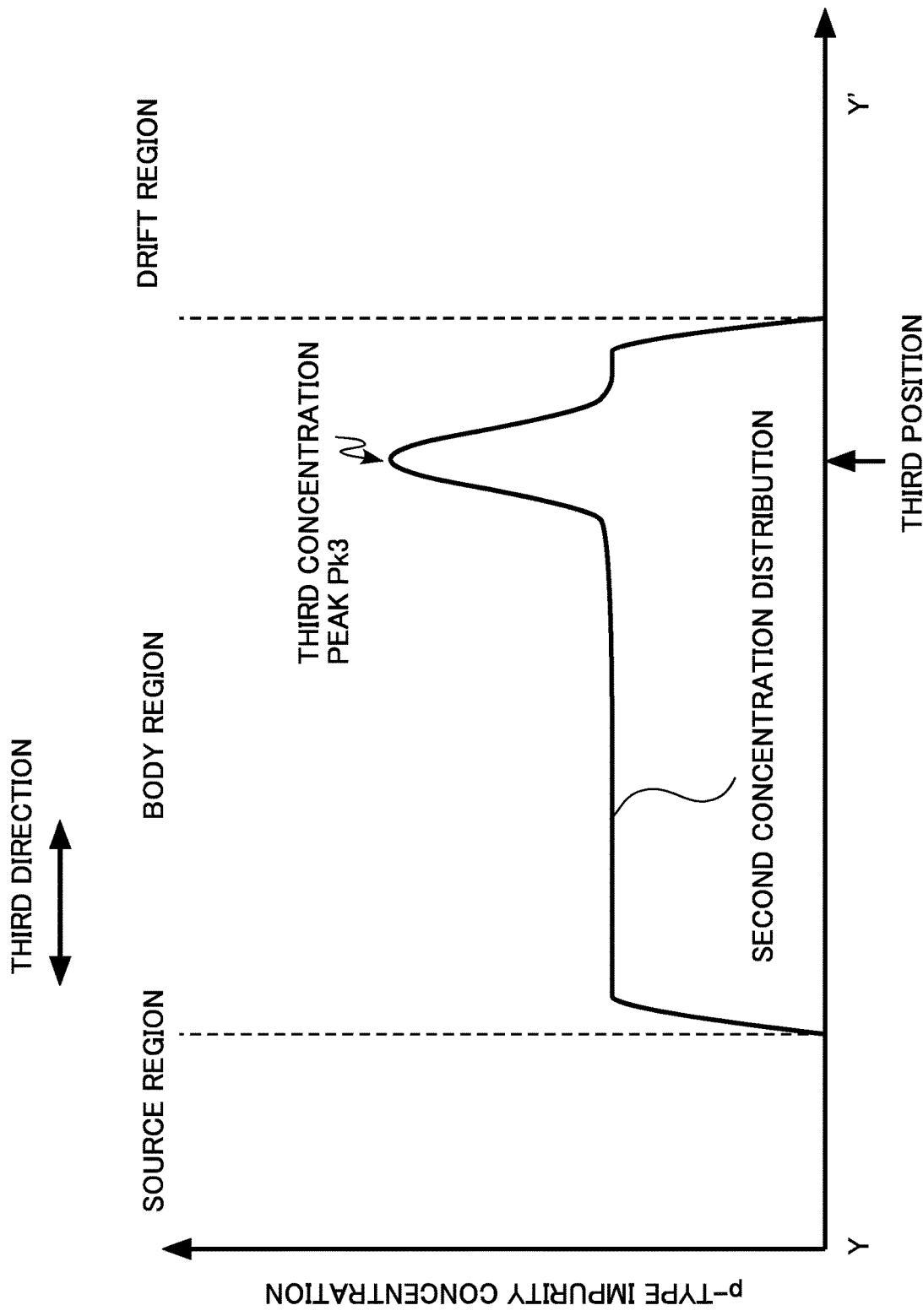
FIG. 14 is a diagram illustrating an impurity concentration distribution of the semiconductor device of the second embodiment.

FIG. 14 is a diagram illustrating an impurity concentration distribution of the semiconductor device of the second embodiment. FIG. 14 illustrates the concentration distribution of the p-type impurity of the body region 28 in the third direction.

In the body region 28, a second concentration distribution of the p-type impurity on a second imaginary line (Y-Y' in FIG. 13) extending along the first side face 21w of the first trench 21a in the third direction perpendicular to the first plane P1 has the third concentration peak Pk3 at a third position. Similarly, in the body region 28, a third concentration distribution of the p-type impurity on a third imaginary line (Z-Z' in FIG. 13) extending along the second side face 21y of the second trench 21b in the third direction perpendicular to the first plane P1 has the fourth concentration peak Pk4 at a fourth position.

A distance to the third position using the first plane P1 as a reference is larger than a depth of the first trench 21a using the first plane P1 as a reference. A distance to the fourth position using the first plane P1 as a reference is deeper than a depth of the second trench 21b using the first plane P1 as a reference.

For example, the p-type impurity concentrations at the third position and the fourth position are equal to or more than $1 \times 10^{18}$ cm$^{-3}$ and equal to or less than $1 \times 10^{19}$ cm$^{-3}$.

Unlike the method of manufacturing the MOSFET 100 of the first embodiment, in a method of manufacturing the MOSFET 200, the p-type impurity is injected into the silicon carbide layer 10 from a part of the first bottom face 21x in the first ion implantation, and the p-type impurity is injected into the silicon carbide layer 10 from another part of the first bottom face 21x in the second ion implantation. In the first ion implantation, the p-type impurity is injected into the silicon carbide layer 10 from a part of the second bottom face 21z, and in the second ion implantation, the p-type impurity is injected into the silicon carbide layer 10 from another part of the second bottom face 21z.

The MOSFET 200 illustrated in FIG. 13 is manufactured by the above manufacturing method.

According to the MOSFET 200 of the second embodiment, the body region 28 is in contact with the first bottom face 21x and the second bottom face 21z, and thus, the electric field strength applied to the first gate insulating layer 18a and the second gate insulating layer 18b can be further reduced. Thus, the reliability of the gate insulating layer of the MOSFET 200 is further improved.

The body region 28 along the first bottom face 21x and the second bottom face 21z also serves as the channel formation region. In other words, a part of the first bottom face 21x and a part of the second bottom face 21z can also be used as the channel formation regions. Thus, the depths of the first trench 21a and the second trench 21b can become shallower than the depth of the MOSFET 100 of the first embodiment.

As described above, according to the second embodiment, the MOSFET capable of reducing the on-resistance can be realized. The MOSFET capable of restraining the short channel effect can be realized. The MOSFET capable of reducing the junction leak current can be realized. The MOSFET that further improves the reliability of the gate insulating layer can be realized.

Third Embodiment

A semiconductor device of a third embodiment is different from the semiconductor device of the first embodiment in that a first electrode includes a first portion disposed in a first trench and the first portion is in contact with a first silicon carbide region. Hereinafter, a part of overlapping contents of the first and second embodiments will not be described.

The semiconductor device of the third embodiment is a vertical MOSFET 300 using silicon carbide. The MOSFET 300 is a MOSFET having a trench-gate structure in which a gate electrode is provided in a trench. The MOSFET 300 is an n-channel MOSFET using electrons as carriers. The MOSFET 300 incorporates a Schottky barrier diode (SBD) as a freewheeling diode.

Figure 15:
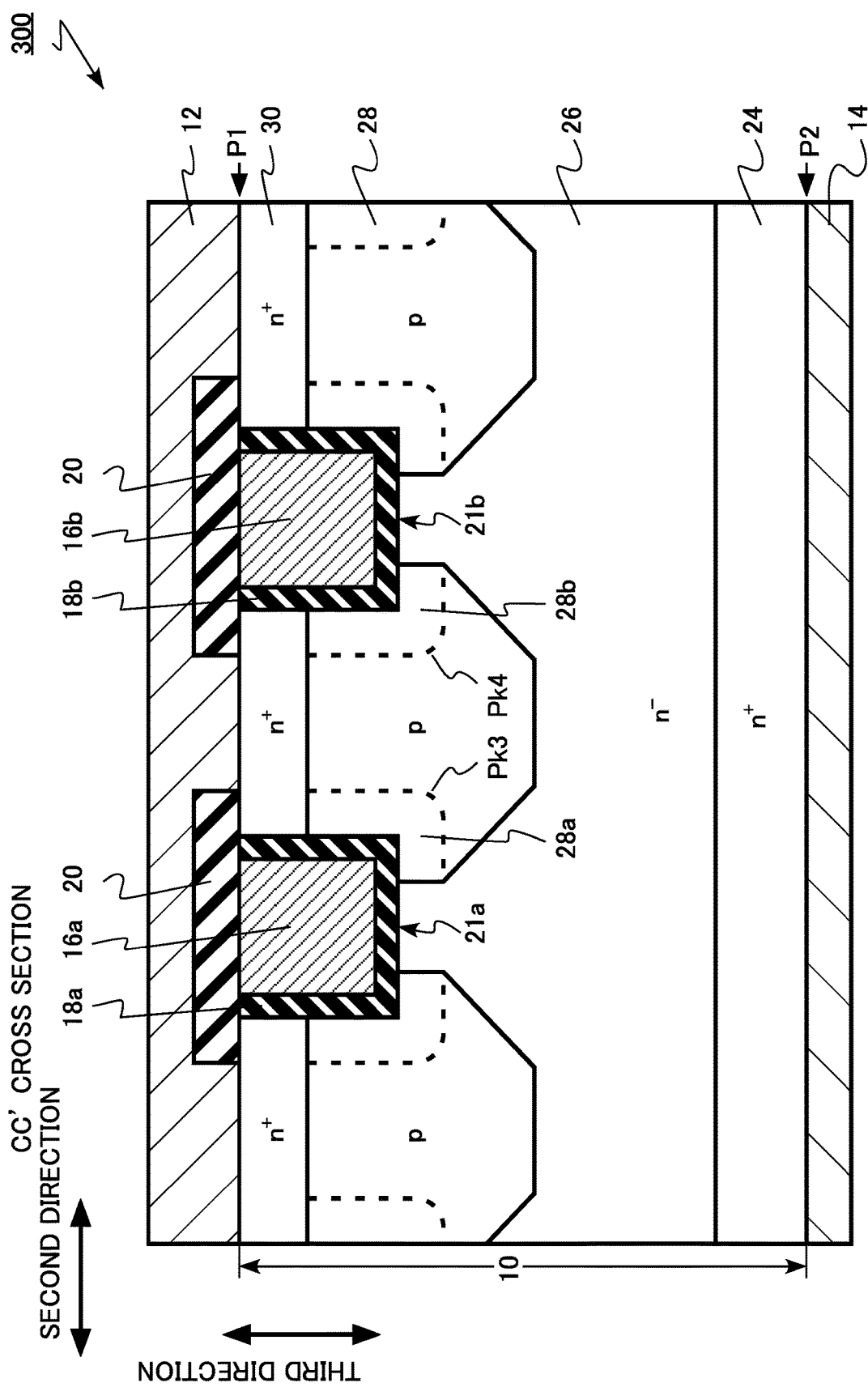
FIG. 15 is a schematic cross-sectional view of a semiconductor device of a third embodiment.
Figure 16:
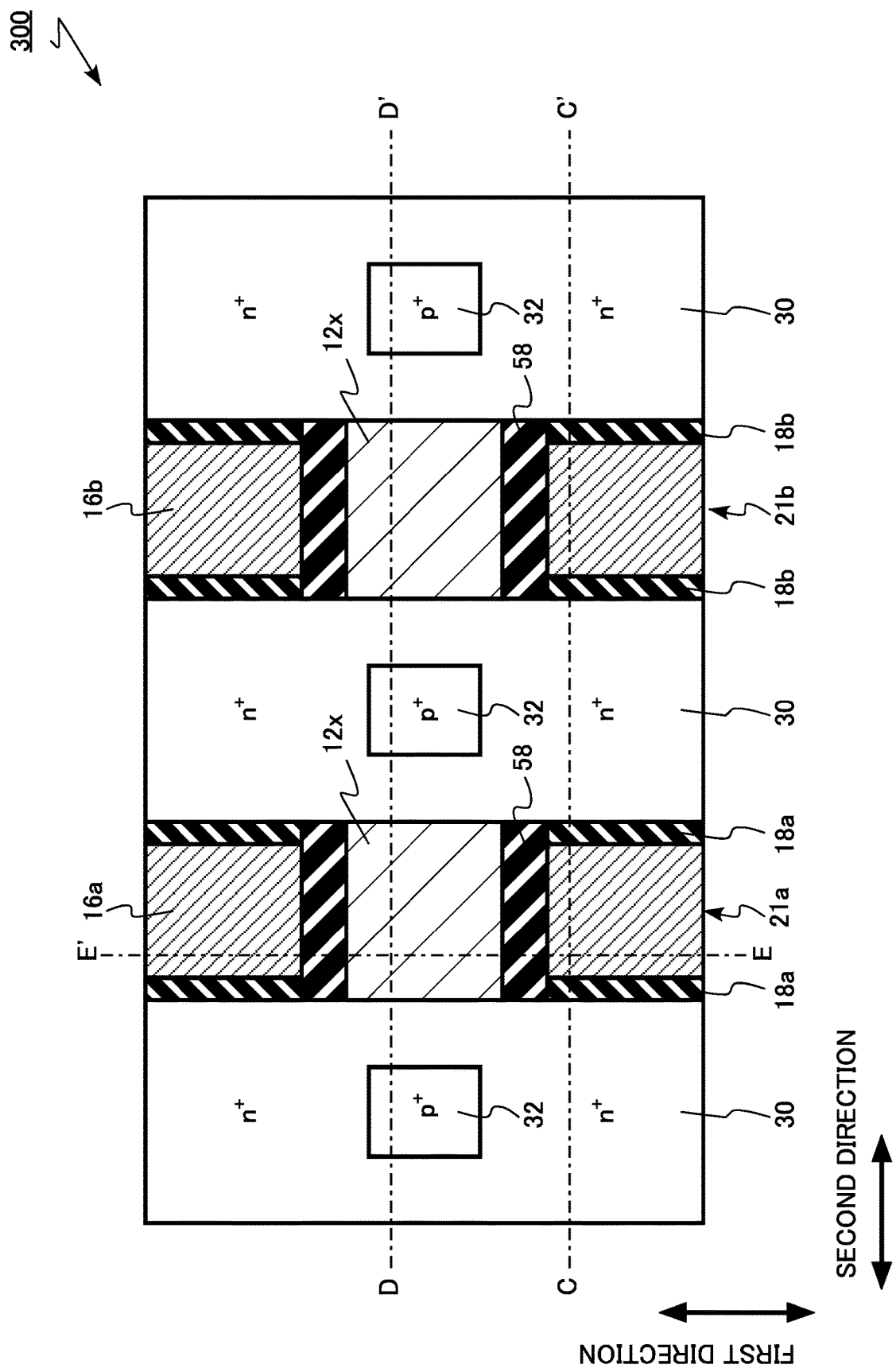
FIG. 16 is a schematic plan view of the semiconductor device according to the third embodiment.
Figure 17:
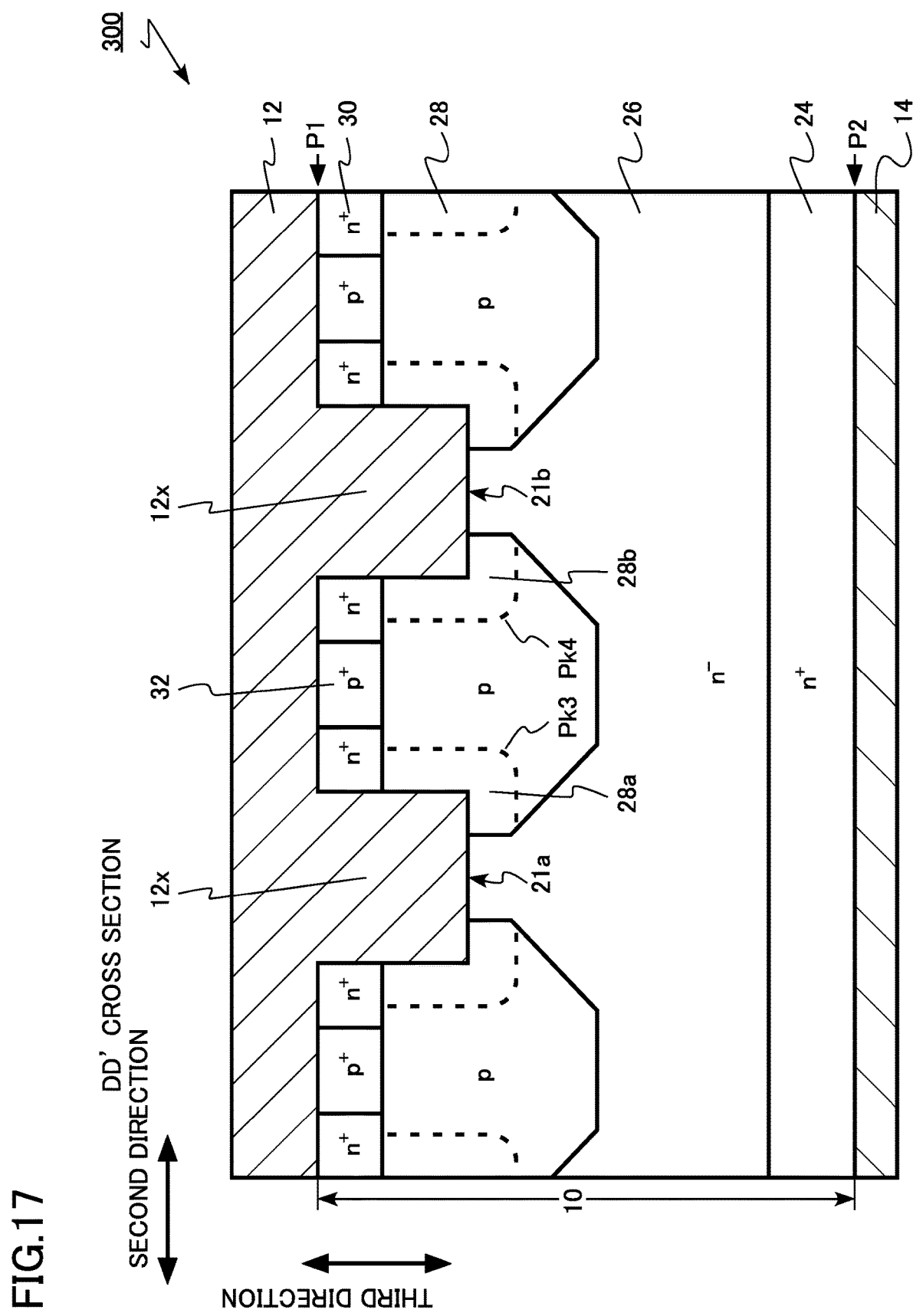
FIG. 17 is a schematic cross-sectional view of the semiconductor device of the third embodiment.
Figure 18:
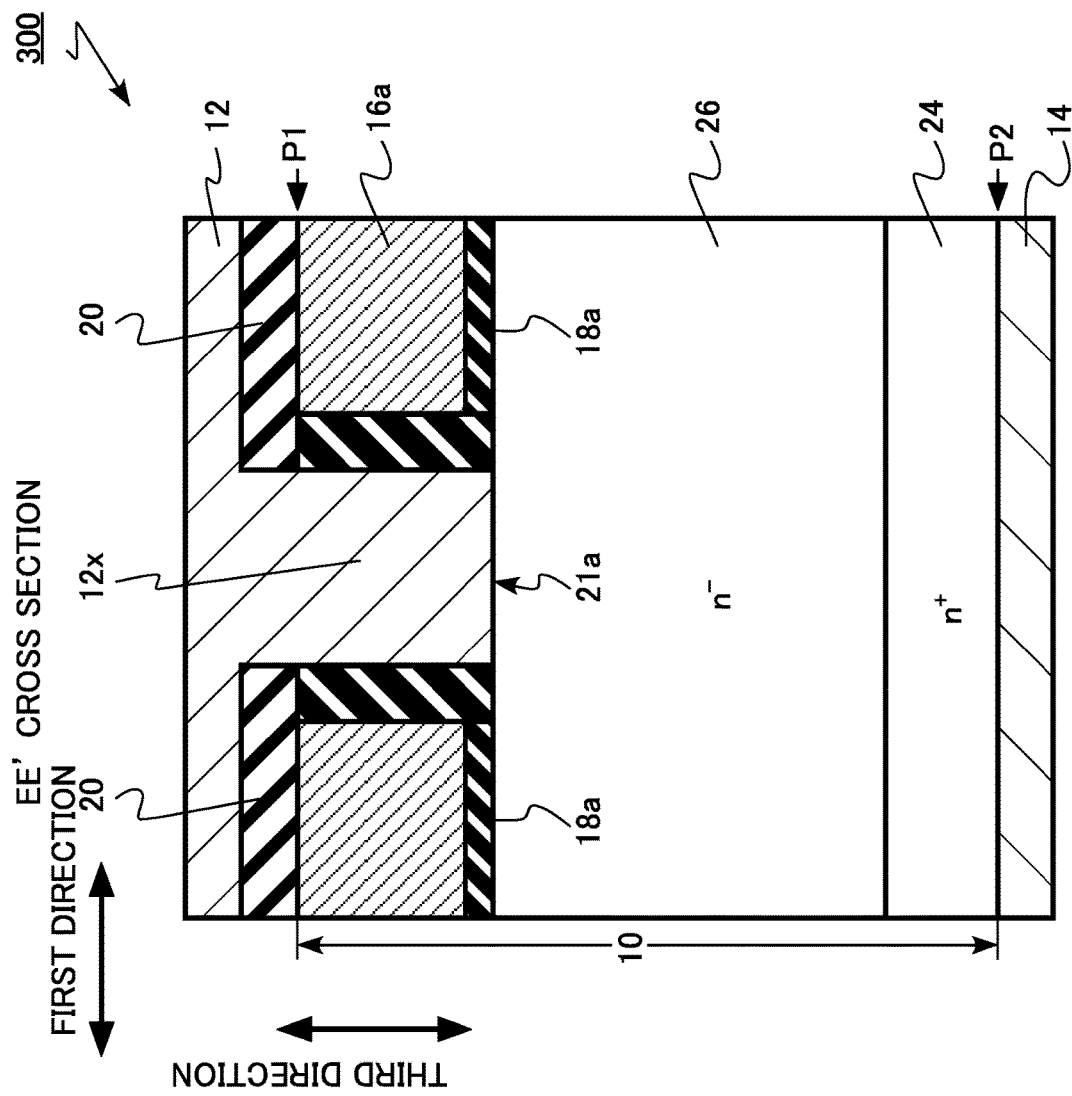
FIG. 18 is a schematic cross-sectional view of the semiconductor device of the third embodiment.

FIG. 15 is a schematic cross-sectional view of the semiconductor device of the third embodiment. FIG. 16 is a schematic plan view of the semiconductor device according to the third embodiment. FIG. 17 is a schematic cross-sectional view of the semiconductor device of the third embodiment. FIG. 18 is a schematic cross-sectional view of the semiconductor device of the third embodiment.

FIG. 15 is a cross-sectional view taken along a line CC' of FIG. 16. FIG. 16 illustrates a pattern on a first plane P1 of FIG. 15. FIG. 17 is a cross-sectional view taken along a line DD' of FIG. 16. FIG. 18 is a cross-sectional view taken along a line EE' of FIG. 16.

The MOSFET 300 includes a silicon carbide layer 10, a source electrode 12 (first electrode), a drain electrode (second electrode), a first gate electrode 16a, a second gate electrode 16b, a first gate insulating layer 18a, a second gate insulating layer 18b, interlayer insulating layers 20, and isolation insulating layers 58. The source electrode 12 includes Schottky regions 12x (first portions).

The silicon carbide layer 10 includes a first trench 21a, a second trench 21b, an n+-type drain region 24, an n−-type drift region 26 (first silicon carbide region), and a p-type body region 28 (second silicon carbide region), an n+-type source region 30 (third silicon carbide region), and p+-type contact regions 32 (fourth silicon carbide region).

The body region 28 includes a first region 28a and a second region 28b. The first region 28a has a third concentration peak Pk3. The second region 28b has a fourth concentration peak Pk4.

The source electrode 12 of the MOSFET 300 includes the Schottky regions 12x. The Schottky regions 12x are disposed in the first trench 21a and the second trench 21b.

The Schottky regions 12x are in contact with the drift region 26. A connection between the Schottky region 12x and the drift region 26 is a Schottky connection.

The isolation insulating layers 58 are disposed in the first trench 21a and the second trench 21b. The isolation insulating layer 58 electrically isolates the first gate electrode 16a and the Schottky region 12x. The isolation insulating layer 58 electrically isolates the second gate electrode 16b and the Schottky region 12x. The isolation insulating layer 58 is, for example, silicon oxide.

In the MOSFET 300, the Schottky regions 12x, the drift region 26, the drain region 24, and the drain electrode 14 constitute the Schottky barrier diode (SBD).

Due to the SBD incorporated in the MOSFET 300, a reverse current, that is, a so-called freewheeling current to flow when the MOSFET 100 is turned off. The SBD is a so-called freewheeling diode.

The MOSFET 300 also incorporates a PN diode including a pn junction between the body region 28 and the drift region 26. Thus, the freewheeling current can flow to this PN diode. However, it is known that when the freewheeling current flows to the PN diode, the on-resistance of the MOSFET is increased, and a reliability failure occurs. It is considered that the increase of the on-resistance is caused by stacking fault growth due to energy released by a bipolar operation of the PN diode.

A rising voltage of the SBD is lower than a rising voltage of the PN diode. Thus, in the MOSFET 300, the SBD operates earlier than the PN diode. Since the SBD performs a unipolar operation, the stacking fault does not grow, and the reliability failure occurs.

In the MOSFET 300, the body regions 28 are provided on both sides of a portion at which the Schottky region 12x is in contact with the drift region 26. Thus, when the SBD is turned off, an interface between the Schottky region 12x and the drift region 26 is covered with a depletion layer extending from the body regions 28 on both sides. Accordingly, a leak current of the SBD is restrained.

As described above, according to the third embodiment, the MOSFET capable of reducing the on-resistance can be realized. The MOSFET capable of restraining the short channel effect can be realized. The MOSFET capable of reducing the junction leak current can be realized. The MOSFET that further improves the reliability of the gate insulating layer can be realized. The MOSFET having the incorporated SBD can be realized.

Fourth Embodiment

A semiconductor device of a fourth embodiment is different from the semiconductor device of the first embodiment in that a first silicon carbide region includes a low concentration region and a high concentration region disposed between a first plane and the low concentration region and having an n-type impurity concentration higher than the low concentration region. Hereinafter, a part of contents overlapping with the contents of the first embodiment will not be described.

The semiconductor device of the fourth embodiment is a vertical MOSFET 400 using silicon carbide. The MOSFET 400 is a MOSFET having a trench-gate structure in which a gate electrode is provided in a trench. The MOSFET 400 is an n-channel MOSFET using electrons as carriers.

Figure 19:
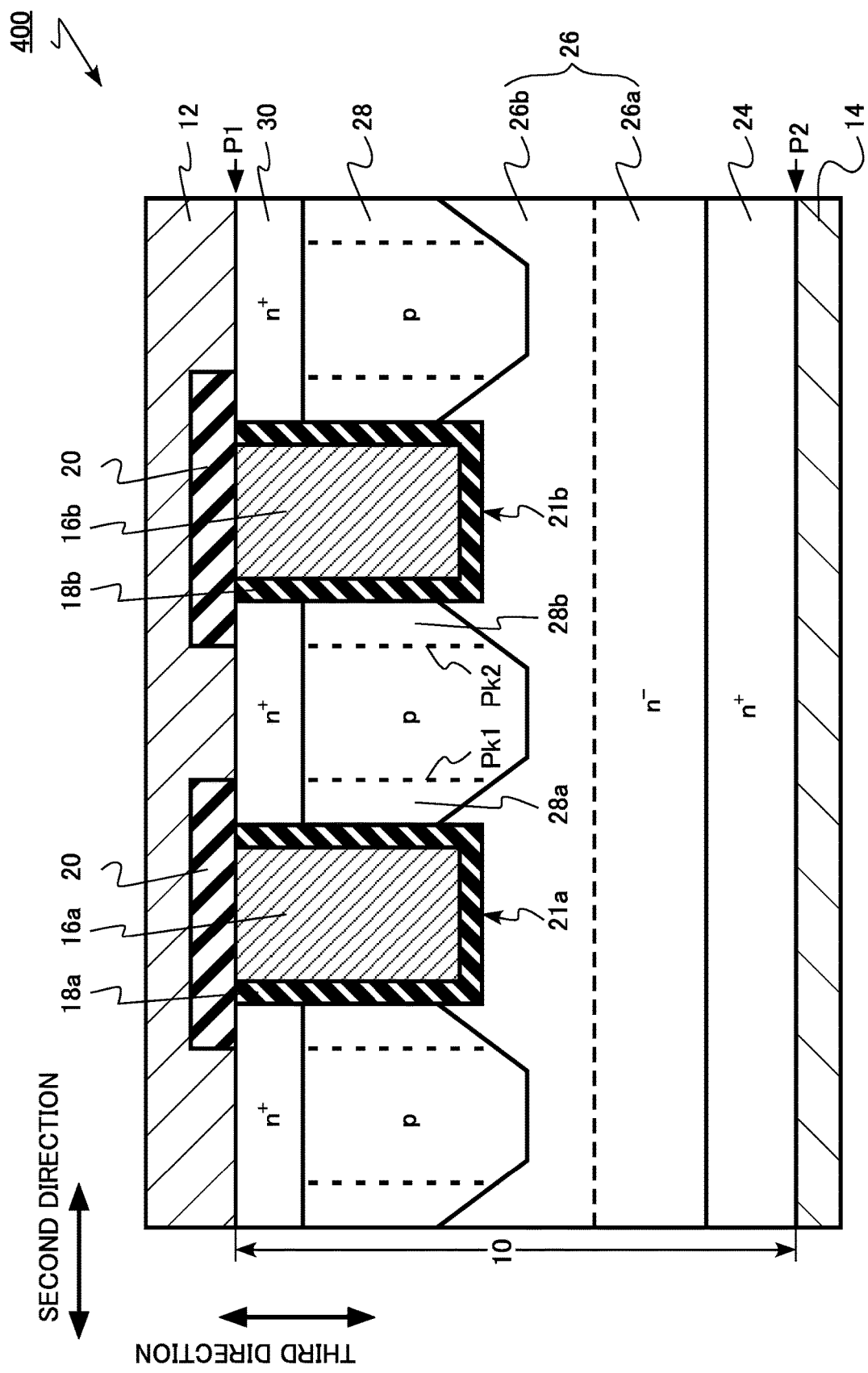
FIG. 19 is a schematic cross-sectional view of a semiconductor device of a fourth embodiment.

FIG. 19 is a schematic cross-sectional view of the semiconductor device of the fourth embodiment. FIG. 19 is a cross section corresponding to FIG. 1 of the first embodiment.

The MOSFET 400 includes a silicon carbide layer 10, a source electrode 12 (first electrode), a drain electrode (second electrode), a first gate electrode 16a, a second gate electrode 16b, a first gate insulating layer 18a, a second gate insulating layer 18b, and interlayer insulating layers 20.

The silicon carbide layer 10 includes a first trench 21a, a second trench 21b, an n+-type drain region 24, an n−-type drift region 26 (first silicon carbide region), and a p-type body region 28 (second silicon carbide region), an n+-type source region 30 (third silicon carbide region), and p+-type contact regions 32 (fourth silicon carbide region). The drift region 26 includes an n−-type low concentration region 26a and an n−-type high concentration region 26b.

The body region 28 includes a first region 28a and a second region 28b. The first region 28a has a first concentration peak Pk1. The second region 28b has a second concentration peak Pk2.

The drift region 26 includes an n−-type low concentration region 26a and an n−-type high concentration region 26b.

The n−-type low concentration region 26a is disposed between the drain region 24 and the first plane P1. The low concentration region 26a contains, for example, nitrogen (N) as an n-type impurity. For example, the n-type impurity concentration of the low concentration region 26a is equal to or more than $4\times10^{14}$ cm$^{-3}$ and is equal to or less than $1\times10^{18}$ cm$^{-3}$.

The n−-type high concentration region 26b is disposed between the low concentration region 26a and the first plane P1. The high concentration region 26b contains, for example, nitrogen (N) as an n-type impurity. The n-type impurity concentration of the high concentration region 26b is higher than the n-type impurity concentration of the low concentration region 26a. For example, the n-type impurity concentration of the high concentration region 26b is equal to or more than $1\times10^{15}$ cm$^{-3}$ and is equal to or less than $5\times10^{18}$ cm$^{-3}$.

The MOSFET 400 includes a low concentration high concentration region 26b below the body region 28. Thus, when the MOSFET 400 is turned on, electrons exiting the channel formed in the body region 28 are likely to be diffused laterally in the drift region 26. Accordingly, the on-resistance of the MOSFET 400 can be reduced.

As described above, according to the fourth embodiment, the MOSFET capable of reducing the on-resistance can be realized. The MOSFET capable of restraining the short channel effect can be realized. The MOSFET capable of reducing the junction leak current can be realized.

Fifth Embodiment

An inverter circuit and a drive device of a fifth embodiment are a drive device including the semiconductor device of the first embodiment.

Figure 20:
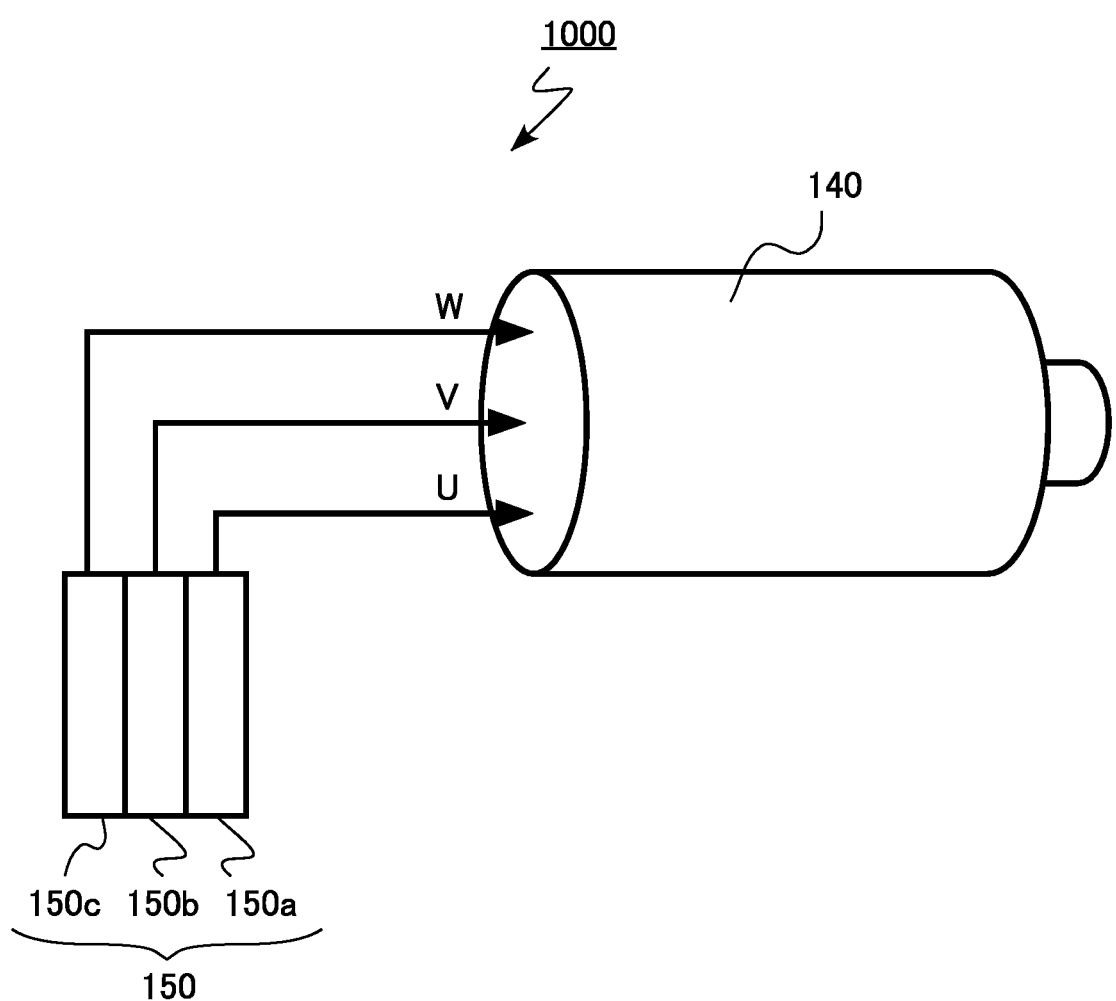
FIG. 20 is a schematic diagram of a drive device according to a fifth embodiment.

FIG. 20 is a schematic diagram of the drive device of the fifth embodiment. A drive device 1000 includes a motor 140 and an inverter circuit 150.

The inverter circuit 150 includes three semiconductor modules 150a, 150b, and 150c each using the MOSFET 100 of the first embodiment as a switching element. The three semiconductor modules 150a, 150b, and 150c are connected in parallel, and thus, a three-phase inverter circuit 150 including three AC voltage output terminals U, V, and W is realized. The motor 140 is driven by an AC voltage output from the inverter circuit 150.

According to the fifth embodiment, the MOSFET 100 having improved characteristics is included, and thus, characteristics of the inverter circuit 150 and the drive device 1000 are improved.

Sixth Embodiment

A vehicle of a sixth embodiment is a vehicle including the semiconductor device of the first embodiment.

Figure 21:
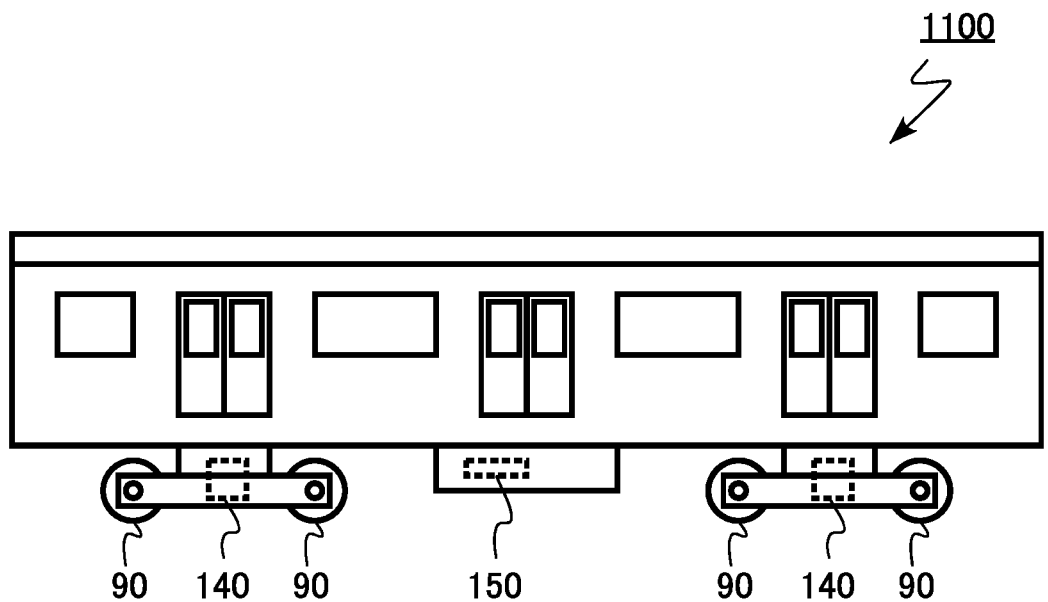
FIG. 21 is a schematic diagram of a vehicle of a sixth embodiment.

FIG. 21 is a schematic diagram of the vehicle of the sixth embodiment. A vehicle 1100 of the sixth embodiment is a railway vehicle. The vehicle 1100 includes a motor 140 and an inverter circuit 150.

The inverter circuit 150 includes three semiconductor modules each using the MOSFET 100 of the first embodiment as a switching element. The three semiconductor modules are connected in parallel, and thus, a three-phase inverter circuit 150 including three AC voltage output terminals U, V, and W is realized. The motor 140 is driven by an AC voltage output from the inverter circuit 150. Wheels 90 of the vehicle 1100 are rotated by the motor 140.

According to the sixth embodiment, the MOSFET 100 having improved characteristics is included, and thus, characteristics of the vehicle 1100 are improved.

Seventh Embodiment

A vehicle of a seventh embodiment is a vehicle including the semiconductor device of the first embodiment.

Figure 22:
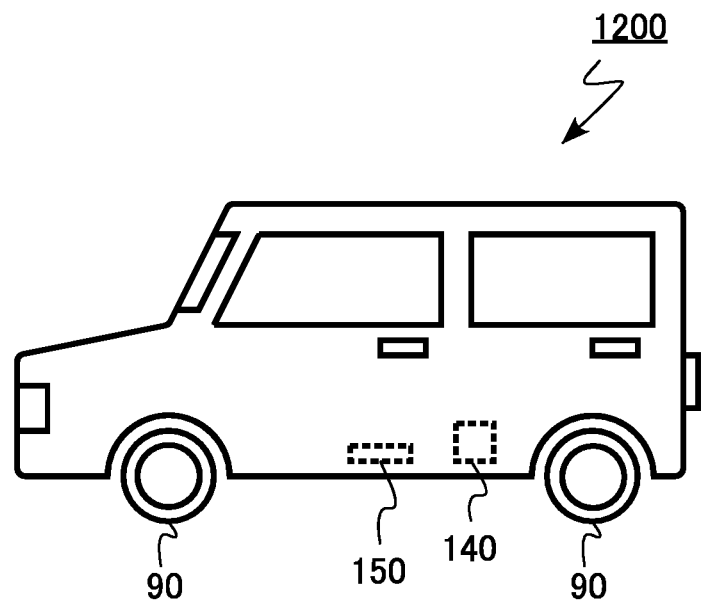
FIG. 22 is a schematic diagram of a vehicle of a seventh embodiment.

FIG. 22 is a schematic diagram of the vehicle of the seventh embodiment. A vehicle 1200 of the seventh embodiment is an automobile. The vehicle 1200 includes a motor 140 and an inverter circuit 150.

The inverter circuit 150 includes three semiconductor modules each using the MOSFET 100 of the first embodiment as a switching element. The three semiconductor modules are connected in parallel, and thus, a three-phase inverter circuit 150 including three AC voltage output terminals U, V, and W is realized.

The motor 140 is driven by an AC voltage output from the inverter circuit 150. Wheels 90 of the vehicle 1200 are rotated by the motor 140.

According to the seventh embodiment, the MOSFET 100 having improved characteristics is included, and thus, characteristics of the vehicle 1200 are improved.

Eighth Embodiment

An elevator according to an eighth embodiment is an elevator including the semiconductor device of the first embodiment.

Figure 23:
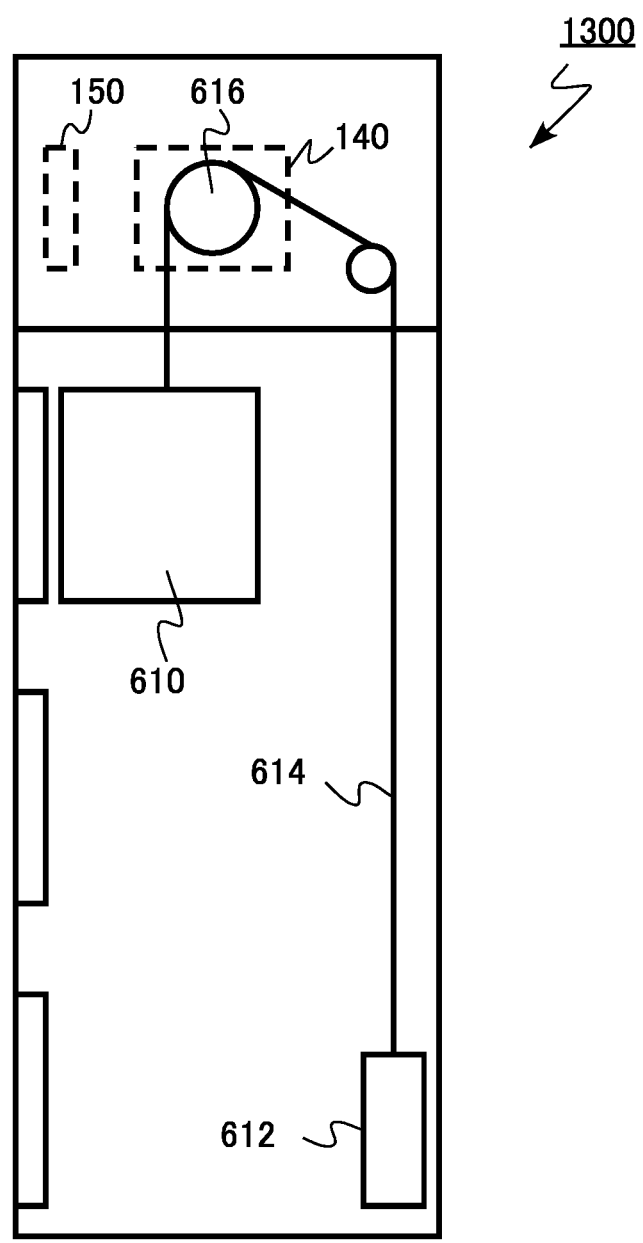
FIG. 23 is a schematic diagram of an elevator according to an eighth embodiment.

FIG. 23 is a schematic diagram of the elevator of the eighth embodiment. An elevator 1300 of the eighth embodiment includes a car 610, a counterweight 612, a wire rope 614, a hoist 616, a motor 140, and an inverter circuit 150.

The inverter circuit 150 includes three semiconductor modules each using the MOSFET 100 of the first embodiment as a switching element. The three semiconductor modules are connected in parallel, and thus, a three-phase inverter circuit 150 including three AC voltage output terminals U, V, and W is realized.

The motor 140 is driven by an AC voltage output from the inverter circuit 150. The hoist 616 is rotated by the motor 140, and thus, the car 610 moves up.

According to the eighth embodiment, the MOSFET 100 having improved characteristics is included, and thus, characteristics of the elevator 1300 are improved.

Although it has been described in the first to fourth embodiments that 4H—SiC is used as the crystal structure of the silicon carbide, the present disclosure can be applied to silicon carbide having other crystal structures such as 6H—SiC and 3C—SiC.

Although it has been described in the fifth to eighth embodiments that the semiconductor device of the first embodiment is included, the semiconductor devices of the second to fourth embodiments can also be applied.

Although it has been described in the fifth to eighth embodiments that the semiconductor device of the present disclosure is applied to the vehicle or the elevator, the semiconductor device of the present disclosure can be applied to, for example, a power conditioner of a solar power generation system.

While certain embodiments have been described, these embodiments have been presented by way of example only, and are not intended to limit the scope of the inventions. Indeed, the semiconductor device, the method of manufacturing a semiconductor device, the inverter circuit, the drive device, the vehicle, and the elevator described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:
1. A semiconductor device, comprising:
   a silicon carbide layer including a first plane parallel to a first direction and a second direction orthogonal to the first direction and a second plane facing the first plane, the silicon carbide layer including a first trench disposed on a side of the first plane and extending in the first direction,
a second trench disposed on the side of the first plane and extending in the first direction,
a first silicon carbide region of n-type,
a second silicon carbide region of p-type disposed between the first silicon carbide region and the first plane, the second silicon carbide region being disposed between the first trench and the second trench, and the second silicon carbide region having a depth deeper than depths of the first trench and the second trench, and
a third silicon carbide region of n-type disposed between the second silicon carbide region and the first plane;
a first gate electrode disposed in the first trench;
a second gate electrode disposed in the second trench;
a first gate insulating layer disposed between the first gate electrode and the silicon carbide layer;
a second gate insulating layer disposed between the second gate electrode and the silicon carbide layer;
a first electrode disposed on the side of the first plane of the silicon carbide layer; and
a second electrode disposed on a side of the second plane of the silicon carbide layer,
wherein:
the second silicon carbide region includes a first region and a second region, a depth of the first region becomes deeper in a direction toward the second trench from the first trench, and a depth of the second region becomes deeper in a direction toward the first trench from the second trench, and
in the second silicon carbide region:
a first concentration distribution of a p-type impurity on a first imaginary line extending in the second direction has a first concentration peak at a first position, and has a second concentration peak at a second position closer to the second trench than the first position, and
a p-type impurity concentration at a third position is lower than a p-type impurity concentration at the first position and a p-type impurity concentration at the second position, wherein the third position is on the first imaginary line and disposed between the first position and the second position.

2. The semiconductor device according to claim 1, wherein a distance from the first trench to the first position and a distance from the second trench to the second position are substantially the same.

3. The semiconductor device according to claim 1, wherein the silicon carbide layer further includes a fourth silicon carbide region of p-type disposed between the second silicon carbide region and the first plane, the fourth silicon carbide region having a p-type impurity concentration higher than the second silicon carbide region, and the fourth silicon carbide region is in contact with the second silicon carbide region.

4. The semiconductor device according to claim 1, wherein p-type impurity concentrations at the first position and the second position are equal to or more than $1 \times 10^{18}$ cm$^{-3}$ and are equal to or less than $1 \times 10^{19}$ cm$^{-3}$.

5. The semiconductor device according to claim 1, wherein p-type impurity concentrations of a portion between the first position and the first trench and a portion between the second position and the second trench are equal to or more than $1 \times 10^{17}$ cm$^{-3}$ and are equal to or less than $5 \times 10^{17}$ cm$^{-3}$.

6. An inverter circuit comprising the semiconductor device according to claim 1.

7. A drive device comprising the semiconductor device according to claim 1.

8. A vehicle comprising the semiconductor device according to claim 1.

9. An elevator comprising the semiconductor device according to claim 1.

10. A semiconductor device, comprising:
a silicon carbide layer including a first plane parallel to a first direction and a second direction orthogonal to the first direction and a second plane facing the first plane, the silicon carbide layer including
a first trench disposed on a side of the first plane and extending in the first direction,
a second trench disposed on the side of the first plane and extending in the first direction,
a first silicon carbide region of n-type,
a second silicon carbide region of p-type disposed between the first silicon carbide region and the first plane, the second silicon carbide region being disposed between the first trench and the second trench, and the second silicon carbide region having a depth deeper than depths of the first trench and the second trench, and
a third silicon carbide region of n-type disposed between the second silicon carbide region and the first plane;
a first gate electrode disposed in the first trench;
a second gate electrode disposed in the second trench;
a first gate insulating layer disposed between the first gate electrode and the silicon carbide layer;
a second gate insulating layer disposed between the second gate electrode and the silicon carbide layer;
a first electrode disposed on the side of the first plane of the silicon carbide layer; and
a second electrode disposed on a side of the second plane of the silicon carbide layer,
wherein:
the first trench includes a first side face and a first bottom face, and the second silicon carbide region is in contact with the first side face and the first bottom face, and
the second trench includes a second side face and a second bottom face, and the second silicon carbide region is in contact with the second side face and the second bottom face, and
the second silicon carbide region includes a first region and a second region, a depth of the first region becomes deeper in a direction toward the second trench from the first trench, and a depth of the second region becomes deeper in a direction toward the first trench from the second trench,
wherein, in the second silicon carbide region, a first concentration distribution of a p-type impurity on a first imaginary line extending in the second direction has a first concentration peak at a first position, and has a second concentration peak at a second position closer to the second trench than the first position.

11. The semiconductor device according to claim 10, wherein, in the second silicon carbide region, a second concentration distribution of a p-type impurity on a second imaginary line extending along the first side face in a third direction perpendicular to the first plane has a third concentration peak at a third position.

12. The semiconductor device according to claim 11, wherein a distance from the first plane to the third position is larger than a depth of the first trench.

13. The semiconductor device according to claim 11, wherein a p-type impurity concentration at the third position is equal to or more than $1\times10^{18}$ cm$^{-3}$ and is equal to or less than $1\times10^{19}$ cm$^{-3}$.

14. A semiconductor device, comprising:
a silicon carbide layer including a first plane parallel to a first direction and a second direction orthogonal to the first direction and a second plane facing the first plane, the silicon carbide layer including
a first trench disposed on a side of the first plane and extending in the first direction,
a second trench disposed on the side of the first plane and extending in the first direction,
a first silicon carbide region of n-type,
a second silicon carbide region of p-type disposed between the first silicon carbide region and the first plane, the second silicon carbide region being disposed between the first trench and the second trench, and the second silicon carbide region having a depth deeper than depths of the first trench and the second trench, and
a third silicon carbide region of n-type disposed between the second silicon carbide region and the first plane;
a first gate electrode disposed in the first trench;
a second gate electrode disposed in the second trench;
a first gate insulating layer disposed between the first gate electrode and the silicon carbide layer;
a second gate insulating layer disposed between the second gate electrode and the silicon carbide layer;
a first electrode disposed on the side of the first plane of the silicon carbide layer; and
a second electrode disposed on a side of the second plane of the silicon carbide layer,
wherein:
the first electrode includes a first portion disposed in the first trench, and the first portion is in contact with the first silicon carbide region,
the second silicon carbide region includes a first region and a second region, a depth of the first region becomes deeper in a direction toward the second trench from the first trench, and a depth of the second region becomes deeper in a direction toward the first trench from the second trench, and
in the second silicon carbide region, a first concentration distribution of a p-type impurity on a first imaginary line extending in the second direction has a first concentration peak at a first position, and has a second concentration peak at a second position closer to the second trench than the first position.

15. A semiconductor device, comprising:
a silicon carbide layer including a first plane parallel to a first direction and a second direction orthogonal to the first direction and a second plane facing the first plane, the silicon carbide layer including
a first trench disposed on a side of the first plane and extending in the first direction,
a second trench disposed on the side of the first plane and extending in the first direction,
a first silicon carbide region of n-type,
a second silicon carbide region of p-type disposed between the first silicon carbide region and the first plane, the second silicon carbide region being disposed between the first trench and the second trench, and the second silicon carbide region having a depth deeper than depths of the first trench and the second trench, and
a third silicon carbide region of n-type disposed between the second silicon carbide region and the first plane;
a first gate electrode disposed in the first trench;
a second gate electrode disposed in the second trench;
a first gate insulating layer disposed between the first gate electrode and the silicon carbide layer;
a second gate insulating layer disposed between the second gate electrode and the silicon carbide layer;
a first electrode disposed on the side of the first plane of the silicon carbide layer; and
a second electrode disposed on a side of the second plane of the silicon carbide layer,
wherein:
the first silicon carbide region includes a low concentration region, and a high concentration region disposed between the first plane and the low concentration region and having an n-type impurity concentration higher than the low concentration region, and
the second silicon carbide region includes a first region and a second region, a depth of the first region becomes deeper in a direction toward the second trench from the first trench, and a depth of the second region becomes deeper in a direction toward the first trench from the second trench,
wherein, in the second silicon carbide region, a first concentration distribution of a p-type impurity on a first imaginary line extending in the second direction has a first concentration peak at a first position, and has a second concentration peak at a second position closer to the second trench than the first position.

16. A method of manufacturing a semiconductor device, the method comprising:
forming a mask material on a side of a first plane of a silicon carbide layer having the first plane parallel to a first direction and a second direction orthogonal to the first direction and a second plane facing the first plane and including a first silicon carbide region of n-type disposed between the second plane and the first plane;
forming openings extending in the first direction in the mask material;
forming trenches by etching the silicon carbide layer using the mask material as a mask;
forming a first region of a second silicon carbide region of p-type by performing a first ion implantation for ion implanting a p-type impurity into the silicon carbide layer in a direction inclined with respect to a normal line of the first plane at a first angle in the second direction, the ion implanting the p-type impurity being performed by using the mask material as a mask;
forming a second region of the second silicon carbide region in contact with the first region by performing a second ion implantation for ion implanting a p-type impurity into the silicon carbide layer in a direction inclined with the normal line of the first plane at a second angle, the second angle is in a direction opposite to the first angle in the second direction, the ion implanting the p-type impurity being performed by using the mask material as the mask;
forming a third silicon carbide region of n-type between the second silicon carbide region and the first plane;
forming a gate insulating layer in the trench;

forming a gate electrode on the gate insulating layer in the trench;

forming a first electrode on a side of the first plane of the silicon carbide layer; and forming a second electrode on a side of the second plane of the silicon carbide layer, wherein, in the second silicon carbide region:
- a first concentration distribution of a p-type impurity on a first imaginary line extending in the second direction has a first concentration peak at a first position, and has a second concentration peak at a second position, and
- a p-type impurity concentration at a third position is lower than a p-type impurity concentration at the first position and a p-type impurity concentration at the second position, wherein the third position is on the first imaginary line and disposed between the first position and the second position.

17. The method of manufacturing a semiconductor device according to claim 16, wherein each of the trenches includes a first side face, a second side face, and a bottom face between the first side face and the second side face, and the p-type impurity is injected into the silicon carbide layer from the first side face and a part of the bottom face in the first ion implantation, and in the second ion implantation, the p-type impurity is injected into the silicon carbide layer from the second side face and another part of the bottom face.

18. The method of manufacturing a semiconductor device according to claim 16, further comprising:

forming an insulating film in the trench before the forming the first region and the second region.

* * * * *